United States Patent
Tsuji

(10) Patent No.: US 6,961,883 B2
(45) Date of Patent: Nov. 1, 2005

(54) TESTER BUILT-IN SEMICONDUCTOR INTEGRATED CIRCUIT DEVICE

(75) Inventor: Takaharu Tsuji, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 587 days.

(21) Appl. No.: 10/136,311

(22) Filed: May 2, 2002

(65) Prior Publication Data

US 2002/0188898 A1 Dec. 12, 2002

(30) Foreign Application Priority Data

Jun. 8, 2001 (JP) .............................. 2001-173969

(51) Int. Cl.[7] .......................... G11C 29/00; G11C 7/00
(52) U.S. Cl. ..................................... 714/721; 365/201
(58) Field of Search .............................. 714/718, 721, 714/724; 365/201; 326/30, 86

(56) References Cited

U.S. PATENT DOCUMENTS 4,464,750 A * 8/1984 Tatematsu .................. 714/719
4,926,363 A * 5/1990 Nix .............................. 702/120
5,910,181 A 6/1999 Hatakenaka et al.

FOREIGN PATENT DOCUMENTS

JP 10-283777 10/1998

* cited by examiner

*Primary Examiner*—Albert Decady
*Assistant Examiner*—Cynthia Britt
(74) *Attorney, Agent, or Firm*—McDermott Will & Emery LLP

(57) ABSTRACT

A terminating circuit for terminating a common data bus to a predetermined voltage level is inactivated in a test mode, a level detection circuit detects a potential of an internal test data bus line coupled to the common data bus line, and an output state of a ternary output circuit is controlled in accordance with a detection result. In a semiconductor integrated circuit device including the memory integrated together with a logic on a common semiconductor substrate, it is accurately determined whether the output state of the memory is a ternary state while operating the memory under actual operation conditions.

14 Claims, 11 Drawing Sheets

| CONDITION | CH | CL | TDO | TOE | TDQ<i> |
|---|---|---|---|---|---|
| TIO > VREFH | H | H | H | H | H |
| VREFH > TIO > VREFL | L | H | L | L | Hi-Z |
| VREFL > TIO | L | L | L | H | L |

TIO = TIO<i>

F I G. 1 2
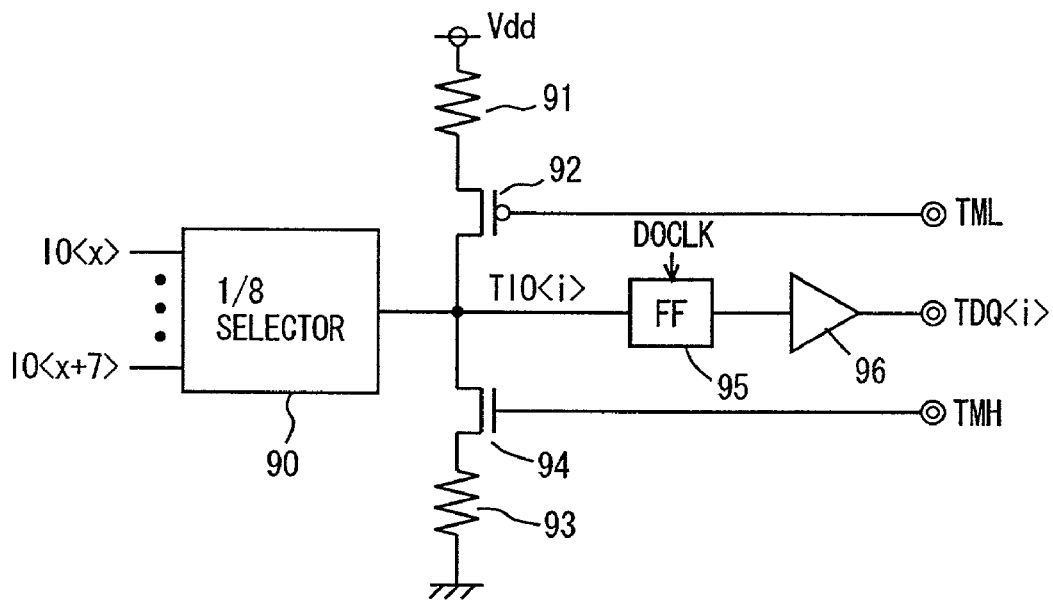
F I G. 1 3
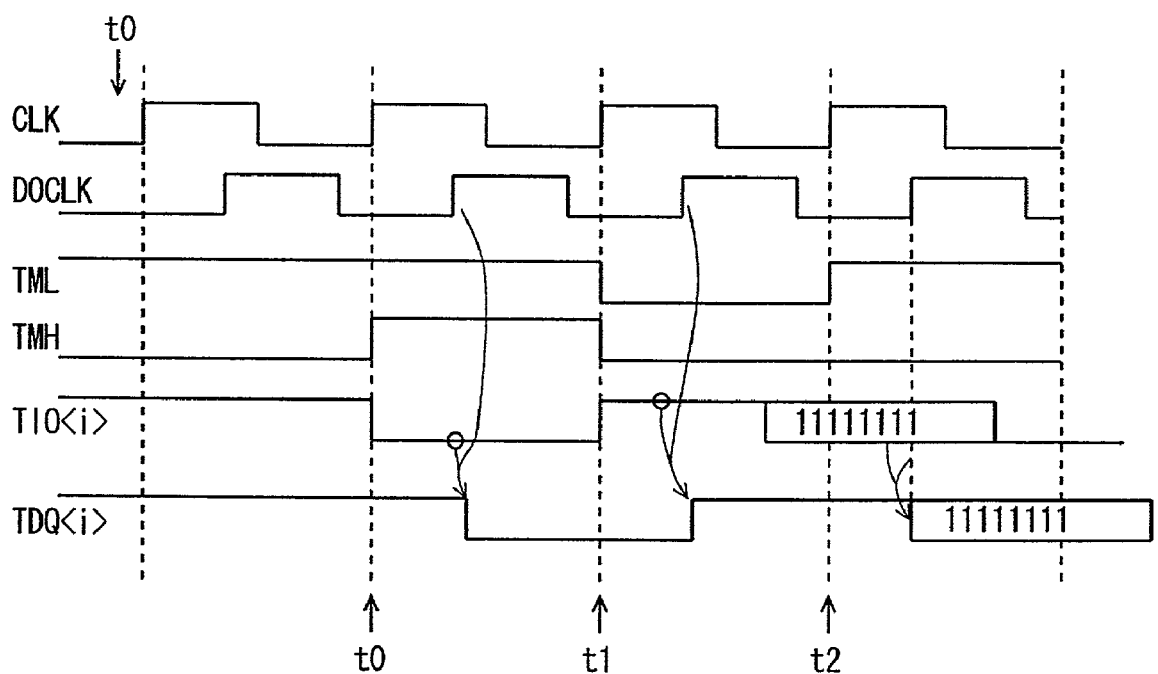

TESTER BUILT-IN SEMICONDUCTOR INTEGRATED CIRCUIT DEVICE

BACKGROUND OF THE INVENTION

1. Field of the Invention

The present invention relates to a semiconductor integrated circuit and particularly relates to a semiconductor integrated circuit having a logic and a memory integrated on the same semiconductor substrate. Specifically, the present invention relates to a construction for testing the memory. More specifically, the present invention relates to a construction for testing a tri-state output circuit of the memory externally.

2. Description of the Background Art

In recent years, as the development of a technique for semiconductor integrated circuit devices progresses, various technical innovations including the miniaturization, high integration and speed up of the circuit devices have been achieved. In order to reduce the manufacturing cost of a semiconductor integrated circuit device and to speed up the operation thereof, a semiconductor device having a semiconductor storage unit (memory) and a semiconductor logic circuit unit (logic) assembled on a single semiconductor chip is under development.

FIG. 16 is a schematic diagram showing an example of the construction of a conventional semiconductor integrated circuit device. In FIG. 16, a semiconductor integrated circuit device 1 includes memories ME0 and ME1 each of which is, for example, a DRAM (dynamic random access memory) and a logic 2 integrated on the same semiconductor chip with memories ME0 and ME1. Memories ME0 and ME1 are coupled to logic 2 in parallel through a common data bus 3. This common data bus 3 includes a memory data bus section 3a coupled to memory ME0, a memory data bus section 3b coupled to memory ME1 and a data bus section 3c coupled to a bus terminating circuit BT.

Bus terminating circuit BT sets the respective bus lines of data bus sections 3, 3a, 3b and 3c at a predetermined voltage level (pulls up or down the respective bus lines of data bus sections 3, 3a, 3b and 3c) since the output circuits of memories ME0 and ME1 enter a high impedance state when being unselected.

Semiconductor integrated circuit device 1 further includes DMA circuits (direct memory access circuits: test interface circuits) TF0 and TF1 provided corresponding to memories ME0 and ME1, respectively. DMA circuits TF0 and TF1 are coupled to memories ME0 and ME1 through data buses 3a and 3b, respectively.

Testers TA0 and TA1 provided externally directly access memories ME0 and ME1 through DMA circuits TF0 and TF1, to execute tests for memories ME0 and ME1, respectively.

Logic 2 and memories ME0 and ME1 are interconnected through an address/command bus 4 transferring addresses and commands. Address/command bus 4 is also connectable to external testers (test units) TA0 and TA1.

By integrating memories ME0 and ME1 on the same semiconductor chip, the interconnection internal common buses 3 and 4 interconnecting logic 2 and memories ME0 and ME1 are made using on-chip interconnection lines. Due to this, compared with on-board wiring, interconnection line load is small, signals/data can be transferred at high speed and high-speed access can be achieved. In addition, since memories ME0 and ME1 are not provided with pin terminals, there are no restrictions such as pitch conditions of the pin terminals and the bus width of common data bus 3 can be set sufficiently large. For example, common data bus 3 has a bus width of 32 to 256 bits, to make it possible to transfer a large quantity of data at high speed.

For the semiconductor integrated circuit device in which logic 2 and memories ME0 and ME1 are integrated on the same semiconductor substrate, an external processor can only transmit and receive data/signals to and from logic 2. Logic 2 accesses memories ME0 and ME1 in accordance with a request of the external processor, executes a necessary processing and stores the execution result in memories ME0 and ME1. Only logic 2 can, therefore, access memories ME0 and ME1.

Accordingly, when memories ME0 and ME1 are tested before the shipment of products and memories ME0 and ME1 are tested through logic 2, then the influence of logic 2 reflects on the test contents, thereby preventing the memories from being accurately tested. Considering such situation, external test units (testers) TA0 and TA1 are allowed to directly access memories ME0 and ME1 using a test interface circuit and to determine whether or not memories ME0 and ME1 satisfy predetermined specification conditions and accurately operate.

Bus terminating circuit BT is provided to prevent common data bus 3 from entering an electrically floating state and to match the output impedance of the output circuits of the memories with the input impedance of logic 2 since memories ME0 and ME1 are coupled in common to data bus 3 and enter a high output impedance state while being unselected.

As for common data bus 3, a write data bus transferring data written to memories ME0 and ME1 and a read data bus transferring data read from memories ME0 and ME1 are provided in common, or the write data bus and the read data bus are provided separately. Since common data bus 3 is shared between memories ME0 and ME1, bus terminating circuit BT fixes the potentials of the respective bus lines of common data bus 3 when memories ME0 and ME1 are unselected.

FIG. 17 is a schematic diagram showing the construction of the data output section of memories ME0 and ME1. Since memories ME0 and ME1 have output sections having the same construction, FIG. 17 representatively shows one memory ME.

In FIG. 17, memory ME includes an output circuit OPK transmitting data read from a memory circuit MKT to the bus lines IO<0> to IO<N−1> of external common data bus 3 in accordance with an output enable signal OE. Memory circuit MKT includes a memory cell array, a memory cell selection circuit, an internal data read circuit and others.

Output circuit OPK includes output buffers OBF's provided corresponding to common data bus lines IO<0> to IO<N−1>, respectively. Each output buffer OBF enters an output high impedance state when output enable signal OE is inactive, which allows data to be transferred between a select memory out of memories ME0 and ME1 and logic 2.

FIG. 18 is a schematic diagram showing the construction of the DMA circuit shown in FIG. 16. Since DMA circuits TF0 and TF1 have the same construction, FIG. 18 representatively shows one DMA circuit TF.

In FIG. 18, DMA circuit TF includes a buffer circuit 500 inputting and outputting data to and from the external test unit (tester), and a data selector 502 for transferring data between buffer circuit 500 and internal data bus lines IO<N−1:0>. Buffer circuit 500 inputs and outputs, as test data TDQ, data of 16 bits or 8 bits in accordance with the number of the data input and output lines of the external test unit (tester). By way of example, FIG. 18 shows a construction in which 8 bits TDB<0> to TDB<7> of test data are inputted and outputted through buffer circuit 500.

Common data bus 3 provided in the semiconductor integrated circuit device, is constituted of data bus lines IO<N−1:0>, and has a width of N bits. Upon outputting data, data selector 502 adjusts the data transfer width between buffer circuit 500 and internal data bus lines IO<N−1:0>. Upon writing test data, data selector 502 is supplied with test data bits TDB<0> to TDB<7> from buffer circuit 500, expands the bit width of the test data bits by a copy operation or the like for transmission onto internal data bus lines IO<N−1:0>. Upon reading test data, data selector 502 converts N-bit test data read onto internal data bus lines IO<N−1:0> into test data TDB<0> to TDB<7> of 8-bit width for outputting. Data selector 502 may sequentially transmit data on internal data bus lines IO<N−1:0> to the test unit (tester) through buffer circuit 500 in a unit of 8 bits, or may selectively transmit data on specific bus lines among internal data bus lines IO<N−1:0> as test data bits TDB<0> to TDB<7> to the test unit (tester) through buffer circuit 500.

In the semiconductor integrated circuit in which logic 2 and memories ME0 and ME1 are integrated on the same semiconductor chip, by utilizing DMA circuits TF0 and TF1, external testers TA0 and TA1 can directly access memories ME0 and ME1 or transmit and receive data to and from memories ME0 and ME1 without using logic 2, respectively. It is, therefore, possible to accurately determine whether or not memories ME0 and ME1 are normally operated.

It is noted that testers TA0 and TA1 may test respective memories ME0 and ME1 simultaneously or individually. Also, testers TA0 and TA1 may be test units having different test contents.

FIG. 19 is a schematic diagram showing the construction of a portion of buffer circuit 500 shown in FIG. 18, which portion is related to 1-bit data. In FIG. 19, buffer circuit 500 includes an inverter 10 inverting a test output enable signal TOE, a tri-state buffer circuit 12 activated when a complementary test output enable signal ZTOE from inverter 10 is inactive (at an H level), for buffering test input data TIO<i> to generate internal test data TOB<i>, a flip-flop (FF) 14 transferring test data bit TDB<i> in accordance with a test data output control clock signal DOCKL when the test data is outputted, and a tri-state buffer circuit 16 activated when test output enable signal TOE is active (at H level), for buffering the test data from flip-flop 14 to generate test output data TIO<i>.

Test output enable signal TOE is a signal applied from the external tester. In accordance with test output enable signal TOE, buffer circuit 500 is set into either a data output mode or a data input mode in a test mode. Memories ME0 and ME1 are clock synchronous type semiconductor memories operating synchronously with a clock signal. A test data output control clock signal DOCLK is generated in accordance with a test clock signal applied in place of the clock signal when buffer circuit 500 is in this test mode. Now, the operation of buffer circuit 500 shown in FIG. 19 will be described.

Now, as shown in FIG. 20, description will be given to a case where bus terminating circuit BT has a pull-up function for pulling up each of internal data bus lines IO<N−1:0> to a power supply voltage Vdd level. Namely, a terminating voltage Vt is at the power supply voltage Vdd level.

When test data is read, data output control clock signal DOCLK is generated in accordance with a master clock signal (test clock signal) CLK. Data D (D0, D1) read to internal data bus line IO<k> are sequentially selected by data selector 502 shown in FIG. 18 and are applied to buffer circuit 500 in accordance with master clock signal CLK. Data selector 502 performs a selection operation in accordance with a test select signal TDS. In accordance with the data read onto internal data bus line IO<k>, output bit TDB<i> of data selector 502 changes.

Flip-flop 14 transfers this test data bit TDB<i> in accordance with data output control clock signal DOCLK. In FIG. 20, in response to the rise of test data output control clock signal DOCLK, test data bit DO is outputted from flip-flop 14 and then test data TIO<i> is outputted through tri-state buffer 1 in an active state.

Accordingly, if internal data bus line IO<k> is pulled up to a bus terminating voltage Vt level, test data bits TDB<i> and TIO<i> are transferred as binary data changing between the H level and the L level in accordance with test data DO (D0, D1).

As shown in FIG. 17, each output buffer OBF in memory ME is in an output high impedance state when memory ME is inactivated. In a default state such as a standby state, test data bit TIO<i> outputted from DMA circuit TF through buffer circuit 500 and tri-state buffer 16 is at the power supply voltage Vdd level. Only when L-level data is outputted, test data output bit TIO<i> is driven to a ground voltage level.

With this construction, therefore, even if each output buffer OBF is set in an output high impedance state in memory ME, test output data bit TIO<i> is at the H level. Therefore, the external tester is unable to identify whether each output buffer in memory ME is outputting H-level data or set in an output high impedance state. That is, it is disadvantageously impossible to identify whether each output buffer OBF in this memory is normally controlled in three states, i.e., an H-level data output state, an L-level data output state and an output high impedance state.

Further, as shown in FIG. 21, if bus terminating voltage Vt is an intermediate voltage Vdd/2 between power supply voltage Vdd and the ground voltage and data at this intermediate voltage level is applied, DMA circuit TF cannot accurately determine whether data is at the H level or the L level. As a result, the output data of DMA circuit TF becomes uncertain. If memory ME outputs binary data, test data TDB<i> and TIO<i> are sequentially generated in accordance with test data IO<k> from the memory. As a result, if this bus terminating voltage is intermediate voltage Vdd/2, it is impossible to identify whether or not the operation of each output buffer OBF is accurately controlled to be in either of the three states in the memory.

Moreover, if bus terminating voltage Vt is an intermediate voltage and data selector 502 in DMA circuit TF has a selector constituted of a CMOS inverter circuit or the like, then a large through-current flows in the CMOS inverter in a selected state in accordance with internal data bit IO<k> at the intermediate voltage level. Likewise, if data selector 502 is an analog switch such as a CMOS transmission gate, a through-current flows in flip-flop 14 in accordance with this signal at the intermediate voltage level in buffer circuit 500. If the output signal of flip-flop 14 is not completely driven into a binary state, a through-current also flows by this signal at the intermediate voltage level in output tri-state buffer 16, making output data uncertain.

Therefore, if such a through-current is generated in DMA circuit TF, the number of internal test data bits is large and a large through-current flows. Accordingly, such a large through-current causes the power supply voltage Vdd level to be lowered or the ground voltage Gnd level to be raised, with the result that memory ME cannot be operated and tested under accurate operation conditions.

SUMMARY OF THE INVENTION

It is an object of the present invention to provide a semiconductor integrated circuit device having a memory assembled together with a logic and having a test interface circuit capable of accurately testing the output buffer of the memory.

It is another object of the present invention to provide a semiconductor integrated circuit device capable of accurately discriminating whether or not the output buffer of a memory is controlled in three states.

A semiconductor integrated circuit according to the first aspect of the present invention includes a memory embedded together with a logic, a test interface circuit for allowing the memory to be accessed from an external and to be tested, and a potential detection circuit provided in this test interface circuit and detecting a potential of a data output bus of the memory.

A semiconductor integrated circuit device according to the second aspect of the present invention includes a memory embedded together with a logic, a test interface circuit for allowing the memory to be accessed from an external during a test, and a switching circuit changing a terminating voltage level of an output data bus of the memory.

By detecting the potential level of the data output bus, it is possible to identify whether this data output bus is held at an intermediate voltage level and whether this data output bus is in a binary state in accordance with test data, and to accurately identify whether the output buffer of the memory is controlled in three states.

Further, by changing a terminating voltage level in a test mode and terminating the data output bus to a voltage level different from the voltage level of the output data of the memory, it is possible to accurately identify whether or not the output buffer of the memory is driven in three states.

Moreover, by changing this terminating voltage level, test data at the intermediate voltage level is applied, as a default, to the test interface circuit. As a result, it is possible to prevent the generation of a through-current in this test interface circuit, to suppress the generation of power supply noise accordingly and to accurately test the memory.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a schematic diagram showing the construction of a DMA circuit in a third embodiment according to the present invention;

FIG. 13 is a timing diagram representing the operation of the DMA circuit shown in FIG. 12;

DESCRIPTION OF THE PREFERRED EMBODIMENTS

[First Embodiment]

Figure 1:
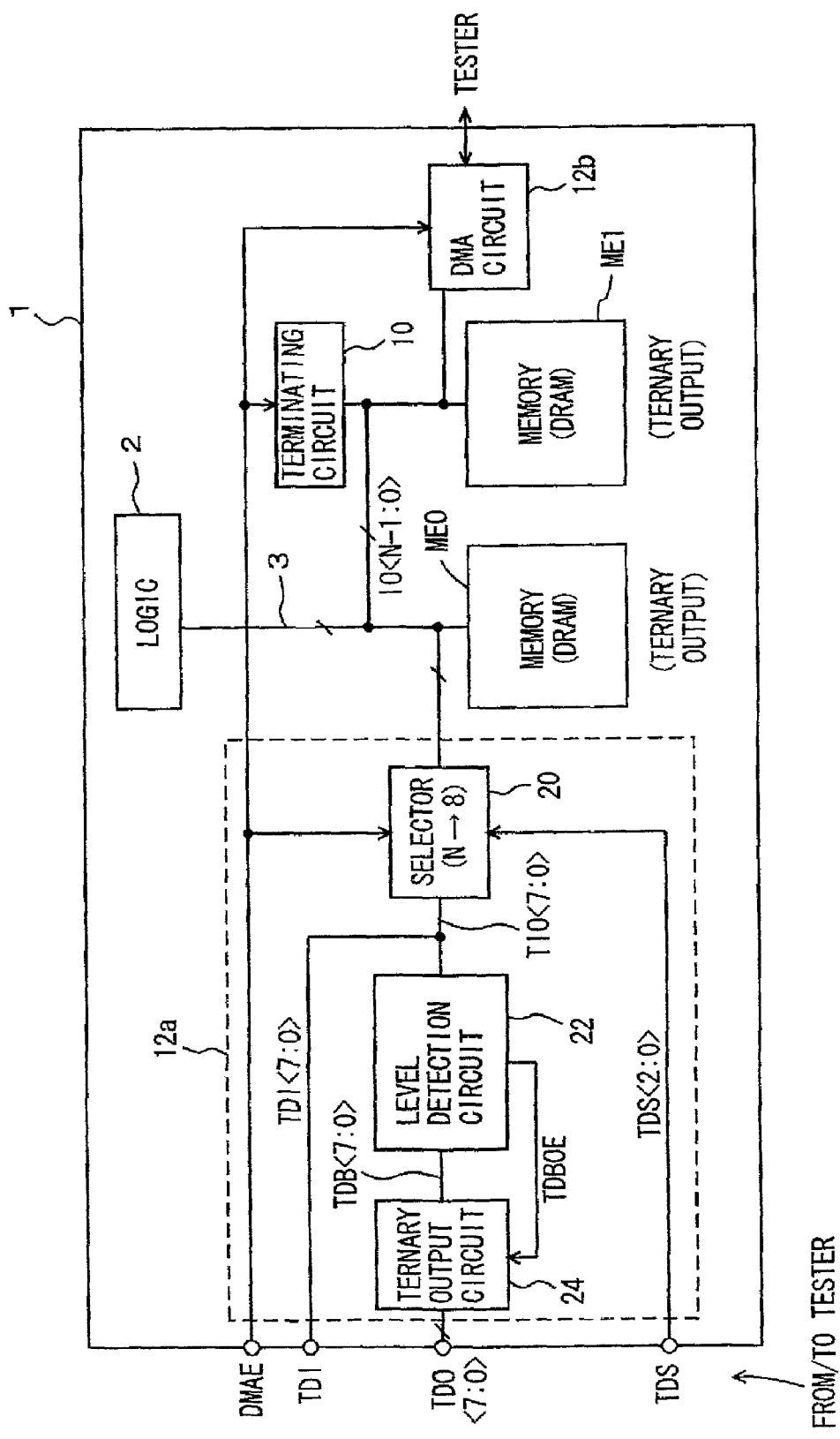
FIG. 1 is a schematic diagram showing the overall construction of a semiconductor integrated circuit device in a first embodiment according to the present invention.

FIG. 1 is a schematic diagram showing the overall construction of a semiconductor integrated circuit device in the first embodiment according to the present invention. In FIG. 1, a semiconductor integrated circuit device 1 includes logic 2 and memories ME0 and ME1 integrated on the same semiconductor substrate as in the case of the conventional semiconductor integrated circuit device previously described. Each of memories ME0 and ME1 is, for example, a DRAM. The output circuit of each of memories ME0 and ME1 includes a ternary (tri-state) data output buffer outputting three states of an H level state, an L level state and a high impedance state.

Memories ME0 and ME1 are coupled to logic 2 through common data bus 3. DMA circuits (test interface circuits) 12a and 12b are provided corresponding to memories ME0 and ME1, respectively. Each of DMA circuits 12a and 12b is supplied with test input data TDI, a test data selection signal TDS and a memory test instructing signal DMAE (DMA enable signal) from a not shown external tester.

Figure 16:
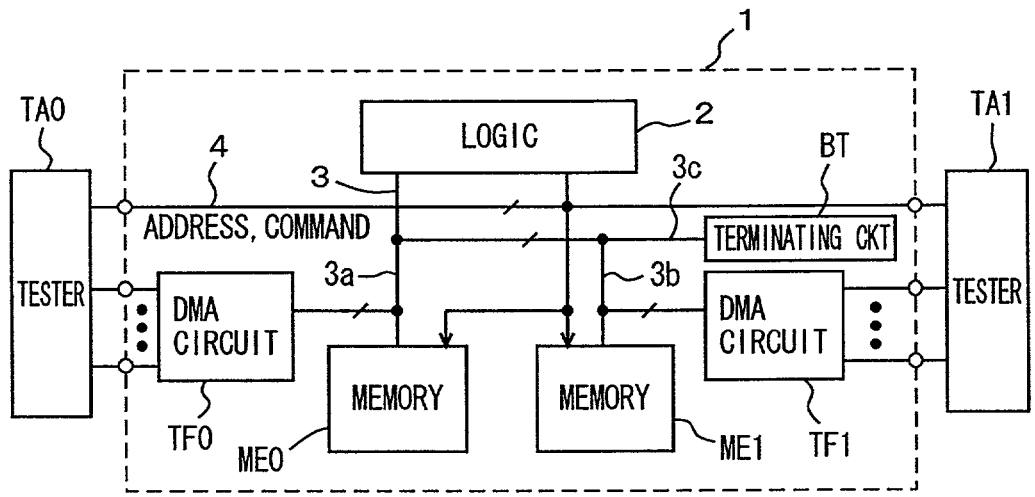
FIG. 16 is a schematic diagram showing the overall construction of a conventional semiconductor integrated circuit device.
Figure 17:
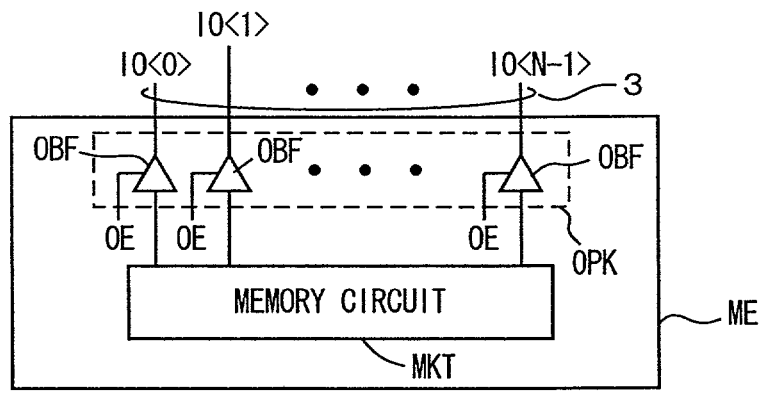
FIG. 17 is a schematic diagram showing the construction of the output section of a memory shown in FIG. 16.
Figure 18:
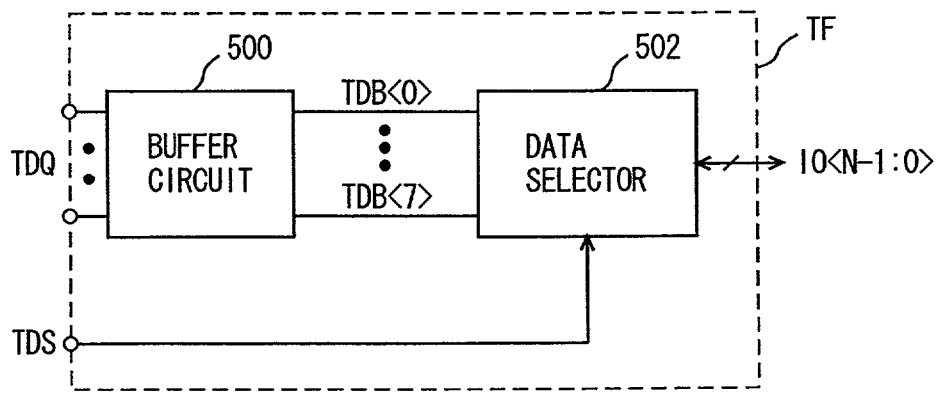
FIG. 18 is a schematic diagram showing the construction of a DMA circuit shown in FIG. 16.
Figure 19:
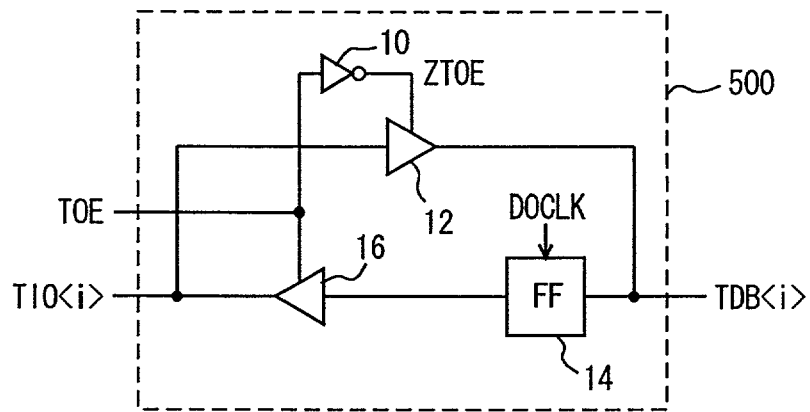
FIG. 19 is a schematic diagram showing the construction of a buffer circuit shown in FIG. 18.
Figure 20:
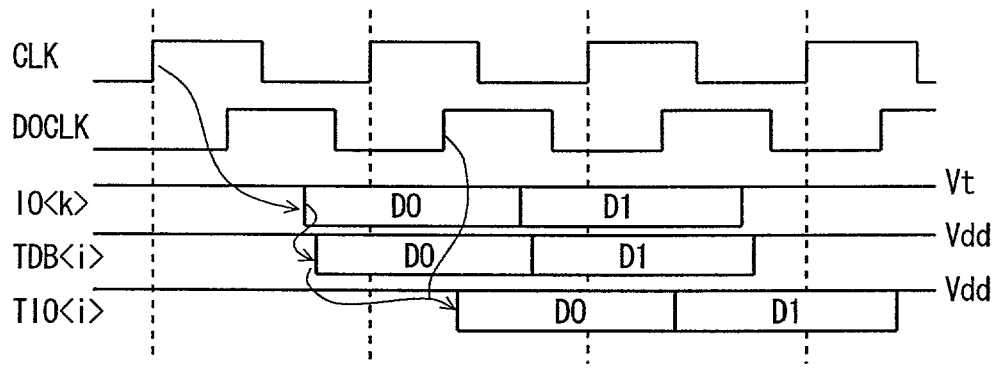
FIG. 20 is a timing diagram representing the operation of the semiconductor integrated circuit device shown in FIG. 18.
Figure 21:
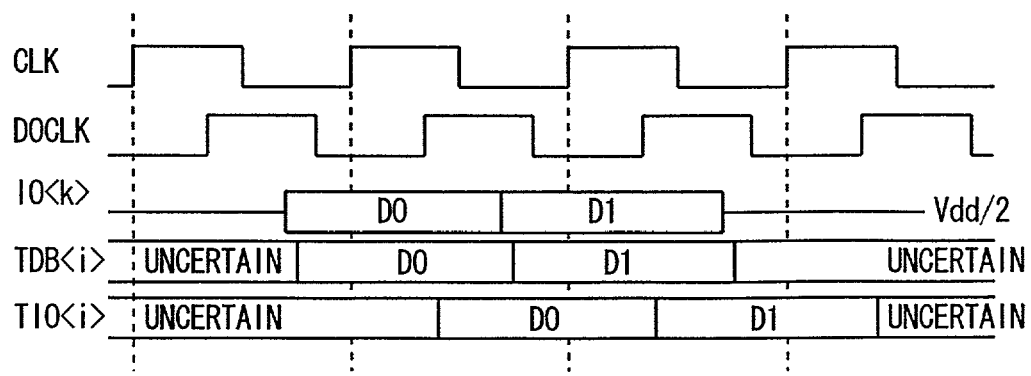
FIG. 21 is a timing diagram representing the operation of the conventional semiconductor integrated circuit device in a test mode.

Also, DMA circuits 12a and 12b output test output data TD to the tester (see FIG. 16). The externally provided tester may be a tester testing memories ME0 and ME1 in common or individually testing memories ME0 and ME1.

A bus terminating circuit 10 selectively terminating bus lines IO<N−1:0> of common data bus 3 in accordance with memory test instructing signal DMAE, is provided for common data bus 3. In FIG. 1, the bus terminating circuit is shown as a terminating circuit. When memory test instructing signal DMAE is in an active state and memory ME0 and/or memory ME1 is to be tested through DMA circuit 12a and/or DMA circuit 12b, the terminating operation of bus terminating circuit 10 is prohibited. On the other hand, when memory test instructing signal DMAE is in an inactive state, bus terminating circuit 10 sets bus lines IO<N−1:0> of common data bus 3 at a predetermined voltage level.

Since DMA circuits 12a and 12b have the same construction, FIG. 1 only shows the construction of DMA circuit 12a.

DMA circuit 12a includes a selector 20 for selectively coupling common data bus 3 and input/output data bus lines TIO<7:0> in accordance with memory test instructing signal DMAE, and a level detection circuit 22 for detecting the voltage levels of the bus lines of test input/output data bus TIO<7:0> and setting the output states of tri-state output buffer circuits included in a ternary output circuit 24 in accordance with the detection result.

In the following description, as for data, a data line and a data bit transmitted on the data line are denoted by the same reference character. Specifically, a test data bit TIO<i> is transmitted on a test data bus line TIO<i>.

Level detection circuit 22 also includes level detectors provided corresponding to the respective bus lines of test input/output data bus TIO<7:0> and sets the output state of each test data bit in either of the three states, i.e., an H level state, an L level state and a high impedance state in accordance with the detection result. The output state of ternary output circuit 24 is set in accordance wit test data bits TDB<7:0> indicating the detection results and an output state control signal TDBOE from level detection circuit 22.

As will be described later in detail, level detection circuit 22 is constituted such that the respective signal lines of test input/output data bus TIO<7:0> are precharged to, for example, an intermediate voltage level, the voltage level of data applied through selector 20 is detected with reference to this precharge voltage, to detect which state the common data bus line selected by selector 20 is in, a high impedance state, an H level data output state or an L level data output state, for outputting signals TDB<7:0> and TDBOE in accordance with the detection result.

If common data bus 3 includes IO<63:0> bus lines of 64 bits, selector 20 executes an 8:1 selection operation (N to 8 selection operation) in accordance with test data select signals TDS<2:0>, and selectively couples 8-bit selected data to test input/output data bus TIO<7:0>.

In FIG. 1, it is shown that memory test instructing signal DMAE is also applied to DMA circuit 12b so as to control the selection operation of DMA circuit 12b. Alternatively, a tester (TA1: see FIG. 16) different from the tester for DMA circuit 12a may apply a memory test instructing signal to DMA circuit 12b and terminating circuit 10 may be prohibited from carrying out a terminating operation if memory test instructing signal DMAE is applied to one of DMA circuits 12a and 12b. Next, the constructions of the constituent elements will be specifically described.

Figure 2:
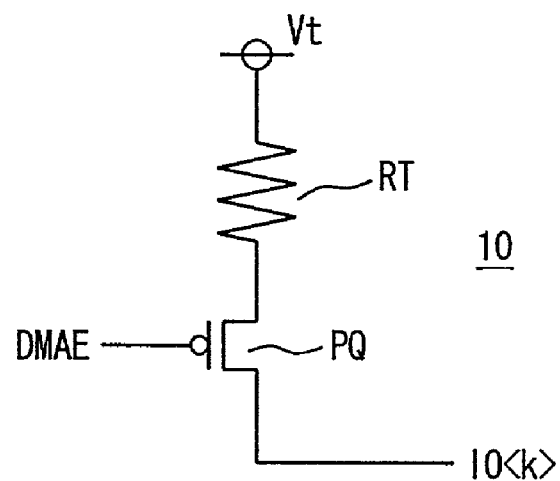
FIG. 2 is a block diagram of a bus terminating circuit shown in FIG. 1.

FIG. 2 shows an example of the construction of bus terminating circuit (which is shown as the terminating circuit in FIG. 1) 10 shown in FIG. 1. In FIG. 2, bus terminating circuit 10 has terminating circuits having the same construction and provided corresponding to respective bus lines IO<N−1:0> of common data bus 3. Therefore, FIG. 2 representatively shows the construction of the terminating circuit provided corresponding to common data bus line IO<k>.

In FIG. 2, bus terminating circuit 10 includes a resistive element RT having one end coupled to a terminating voltage source supplying a terminating voltage Vt, and a P channel MOS (insulated gate type field effect) transistor PQ connected between resistive element RT and common data bus line IO<k> and having a gate receiving memory test instructing signal DMAE. The resistance value of resistive element RT is set sufficiently high to set common data bus line IO<k> at a terminating voltage Vt level when the terminating circuit is active. Terminating voltage Vt is at a power supply voltage Vdd level. This terminating voltage may be at the voltage level of an intermediate voltage Vdd/2, as will be described later.

When memory test instructing signal DMAE is in an inactive state (which state will be referred to as "normal operation mode" hereinafter), memory test instructing signal DMAE is at the L level, P channel MOS transistor PQ is in a conductive state and common data bus line IO<k> is pulled up to the terminating voltage Vt level. Each of memories ME0 and ME1 shown in FIG. 1 drives common data bus 3 in accordance with output data when being active. Also, logic 2 drives common data bus 3 in accordance with write data when being operated.

It is noted that common data bus 3 may be a data bus transmitting both write data and read data as described with reference to the conventional semiconductor integrated circuit device or may be a bus transferring write data and read data separately. Bus terminating circuit 10 terminates a bus (or bus line) transferring data read from memories ME0 and ME1.

If memory test instructing signal DMAE is at the H level, or in an active state and designates a mode for testing the tri-state operations of the output buffers of memories ME0 and ME1, P channel MOS transistor PQ turns nonconductive and common data bus line IO<k> is disconnected from the terminating voltage source. Accordingly, in the mode for testing the operation states of the output buffers of memories ME0 and ME1 (which mode will be referred to as "memory test mode" hereinafter), the respective bus lines of common data bus lines IO<N−1:0> are not pulled up (not terminated). Thus, if both memories ME0 and ME1 are inactive or the output buffers of the memories are in an output high impedance state, each of bus lines IO<N−1:0> of common data bus 3 enters a floating state in a high impedance state.

Level detection circuit 22 shown in FIG. 1 is coupled to the common data bus lines through selector 20, equivalently functions as a bus terminating circuit, sets the terminating voltage at a predetermined voltage level, detects the voltage level of the bus line selected by selector 20 in this DMA circuit on the basis of the predetermined voltage, and identifies the output states of the output buffers of memory ME0 or ME1. By making bus terminating circuit 10 inactive in the memory test mode, DMA circuits 12a and 12b can set this bus terminating voltage at a desired voltage level and determine whether a selected memory of interest is in the ternary output state in accordance with the set voltage.

Figure 3:
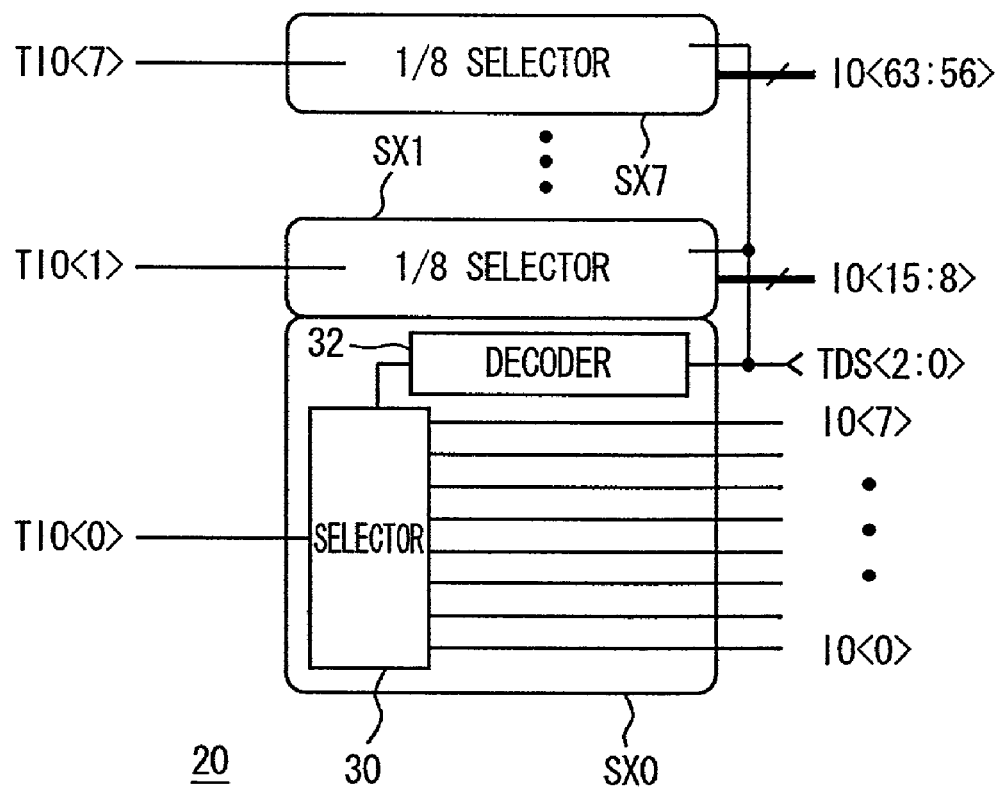
FIG. 3 is a schematic diagram showing the construction of a selector shown in FIG. 1.

FIG. 3 shows an example of selector 20 shown in FIG. 1. In FIG. 3, selector 20 includes selectors SX0 to SX7 each arranged corresponding to a predetermined number of bus lines of common internal data bus 3. When common internal data bus 3 has a width of 64 bits, selectors SX0 to SX7 each are arranged corresponding to the 8-bit bus lines and selectors SX0 to SX7 each carry out 8:1 selection operation. That is, ⅛ selector SX0 is arranged corresponding to common data bus lines IO<7:0>=IO<7> to IO<0>, ⅛ selector SX1 is arranged corresponding to common data bus lines IO<15:8>, . . . and ⅛ selector SX7 is arranged corresponding to common data bus lines IO<63:56>. Since ⅛ selectors SX0 to SX7 have the same construction, FIG. 3 representatively shows the internal construction of ⅛ selector SX0.

⅛ selector SX0 includes a decoder 32 for decoding 3-bit test data select signals TDS<2:0> and generating 8-bit decode signals, and a selector 30 for selecting corresponding one of 8-bit common data bus lines IO<7:0> in accordance with the output signals of decoder 32. While decoder 32 is arranged for each of ⅛ selectors SX0 to SX7 in the construction shown in FIG. 3, decoder 32 may be provided in common to ⅛ selectors SX0 to SX7.

Selector 20 performs the ⅛ selection operation on 64-bit common data bus lines IO<63:0> and selected 8-bit data is transmitted to internal test data bus lines TIO<7:0>, respectively.

Figure 4:
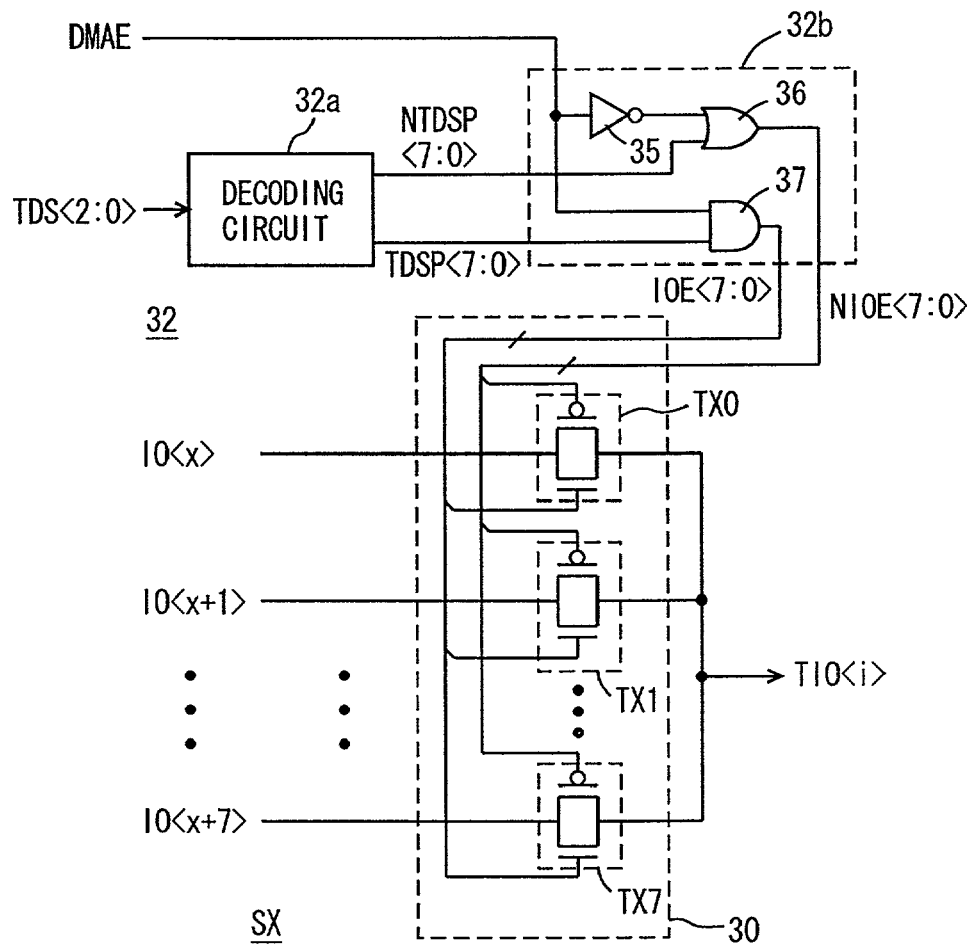
FIG. 4 is a block diagram specifically showing the construction of a ⅛ selector shown in FIG. 3.

FIG. 4 is a block diagram showing the construction of ⅛ selectors SX0 to SX7 shown in FIG. 3 more specifically. Since ⅛ selectors SX0 to SX7 have the same construction, FIG. 4 representatively shows the construction of one ⅛ selector SX. Decoder 32 includes a decoding circuit 32a for decoding test data select signals TDS<2:0> and generating complementary decode signals TDSP<7:0> and NTDSP<7:0>, and a select signal generation circuit 32b for generating complementary data line select signals IOE<7:0> and NIOE<7:0> in accordance with decode signals TDSP<7:0> and NTDSP<7:0> outputted from decoding circuit 32a and memory test instructing signal DMAE.

While select signal generation circuit 32b includes groups of circuits provided corresponding to the respective complementary bit pairs of decode signals TDSP<7:0> and NTDSP<7:0>, FIG. 4 representatively shows a circuit for processing 8-bit signals. Decoding circuit 32a decodes 3-bit test data select signals TDS<2:0> and generates 8-bit decode signals TDSP<7:0> and NTDSP<7:0>. As a result, one bit of decode signals TDSP<7:0> enters a selected state and one bit of complementary decode signals NTDSP<7:0> enters a selected state.

Select signal generation circuit 32b includes an inverter 35 receiving memory test instructing signal DMAE, an OR circuit 36 receiving the output signal of inverter 35 and complementary decode signals NTDSP<7:0> and generating complementary data line select signals NIOE<7:0>, and an AND circuit 37 receiving memory test instructing signal DMAE and decode signals TDSP<7:0> and generating data line select signals IOE<7:0>. Each of OR circuit 36 and AND circuit 37 includes gates provided corresponding to the respective bits of data line select signals IOE<7:0> and NIOE<7:0>, and executes a logic processing for each bit.

When memory test instructing signal DMAE is at the L level, the output signal of inverter 35 turns H level, all the bits of data line select signals NIOE<7:0> are at the H level and all the bits of data line select signals IOE<7:0> are at the L level. When test instructing signal DMAE is at the L level, selector 30 is rendered nonconductive to disconnect test data bus TIO from common data bus 3.

On the other hand, when memory test instructing signal DMAE is at the H level, the output signal of inverter 35 turns L level and AND circuit 37 and OR circuit 36 generate data line select signals IOE<7:0> and NIOE<7:0> in accordance with decode signals TDSP<7:0> and NTDSP<7:0>, respectively.

Selector 30 includes transmission gates TX0 to TX7 provided corresponding to 8-bit common data bus lines IO<x> to IO<x+7>, respectively. Transmission gates TX0 to TX7 are selectively set in a conductive state in accordance with the corresponding bits of data line select signals IOE<7:0> and NIOE<7:0>. Transmission gates TX0 to TX7 are coupled in common to internal test data bus line TIO<i>.

Each of transmission gates TX0 to TX7 is constituted of a P channel MOS transistor and an N channel MOS transistor connected in parallel. When made conductive, each of transmission gates TX0 to TX7 operates as an analog switch transmitting a signal on a corresponding common data bus line to internal test data bus line TIO<i>. Accordingly, signals corresponding to the signal potentials on common data bus lines IO<x> to IO<x+7> are selectively transmitted to internal test data bus line TIO<i>.

When data line select signals IOE<0> and NIOE<0> are, for example, at the H level and the L level, respectively, transmission gate TX0 turns conductive and remaining transmission gates TX1 to TX7 are maintained nonconductive. In this state, therefore, common data bus line IO<x> is coupled to internal test data bus line TIO<i>. Level detection circuit 22 terminates the selected common data bus line IO<x> to the predetermined voltage level through internal test data bus line TIO<i>.

Figure 5:
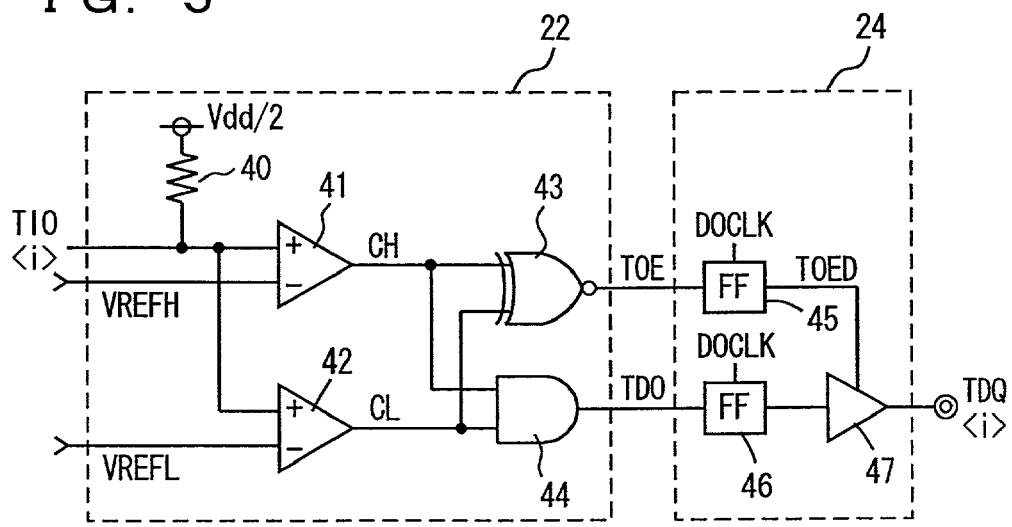
FIG. 5 is a block diagram showing the constructions of a level detection circuit and a ternary output circuit.

FIG. 5 is a block diagram showing the constructions of level detection circuit 22 and ternary output circuit 24 as shown in FIG. 1. FIG. 5 representatively shows the construction of portions of level detection circuit 22 and ternary output circuit 24 related to 1-bit internal test data bus line TIO<i>.

In FIG. 5, level detection circuit 22 includes a terminating resistive element 40 for terminating internal test data bus line TIO<i> to the intermediate voltage Vdd/2 level, a comparison circuit 41 for comparing the voltage of a signal on internal test data bus line TIO<i> with a reference voltage VREFH and generating an output signal CH in accordance with the comparison result, a comparison circuit 42 for comparing the voltage of the signal on internal test data bus line TIO<i> with a reference voltage VREFL and generating a signal CL in accordance with the comparison result, an EXNOR circuit 43 detecting whether output signals CH and CL of comparison circuits 41 and 42 are coincident or non-coincident with each other and generating an output enable signal TOE in accordance with the detection result, and an AND circuit 44 receiving output signals CH and CL of comparison circuits 41 and 42 and generating test output data TDO.

Output signal TOE from EXNOR circuit 43 corresponds to output state control signal TDBOE shown in FIG. 1. The state of output enable signal TOE is set for each test data output bit.

Reference voltage VREFH is higher than the intermediate voltage Vdd/2 and reference voltage VREFL is lower than the intermediate voltage Vdd/2. If the voltage of the signal on internal test data bus line TIO<i> is higher than reference voltage VREFH, comparison circuit 41 drives output signal CH thereof to the H level. Likewise, if the voltage of the signal on internal data bus line TIO<i> is higher than reference voltage VREF, comparison circuit 42 drives output signal CL thereof to the H level. It is, therefore, possible to detect at which level the voltage of the signal on internal test data bus line TIO<i> is, a voltage level higher than the reference voltage VREFH level, a voltage level between the reference voltages VREFH and VREFL levels or a voltage level lower than the reference voltage VREFL level according to output signals CH and CL of comparison circuits 41 and 42.

In the memory test mode, bus terminating circuit 10 provided for common data bus 3 is in an inactive state in accordance with memory test instructing signal DMAE and the terminating operation thereof for each of bus lines IO<N−1:0> (=IO<63:0>) of common data bus line 3 is stopped. In the memory test mode, one common data bus line is selected by selector 30 shown in FIG. 4 and coupled to internal test data bus line TIO<i>. Selector 30 is an analog switch, and terminating resistive element 40 of level detection circuit 22 shown in FIG. 5 equivalently terminates the common data bus line, terminated to the power supply voltage level in the normal operation mode, to the intermediate voltage Vdd/2 level. Accordingly, if common data bus line IO<i> is at a voltage level between the reference voltage VREFH and VREFL levels while a memory test is performed, it is possible to determine that the corresponding output circuit of the memory is in an output high impedance state. By setting the output state of ternary output circuit 24 in accordance with this determination result, the external tester can identify the three states of the output of the memory.

Ternary output state 24 includes a flip-flop (FF) 45 for delaying test output enable signal TOE from level detection circuit 22 in accordance with test data output control clock signal DOCLK and generating a delayed output enable signal TOED, a flip-flop (FF) 46 for transmitting test output data TDO from level detection circuit 22 in accordance with test data output control clock signal DOCLK, and a tri-state buffer circuit 47 selectively activated in accordance with delayed output enable signal TOED from flip-flop 45 and generating test output data TDQ<i> in accordance with the output signal of flip-flop 46 when made active.

Tri-state buffer circuit 47 enters an output high impedance state when delayed output enable signal TOED from flip-flop 45 is in an inactive state. Therefore, by setting the output state of tri-state buffer circuit 47 in accordance with output signals TOE and TDO of level detection circuit 22, it is possible to identify in which state of the three states the output buffer of the memory is.

Figures 6, 7:
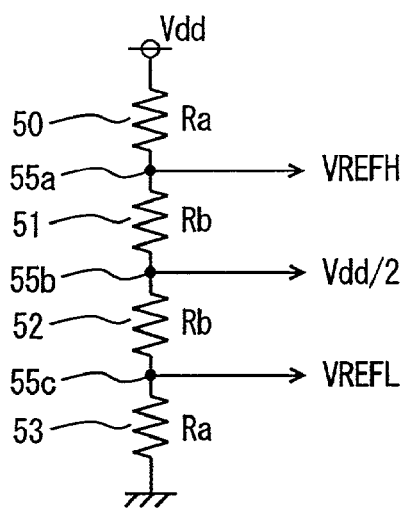
FIG. 6 shows a list of the input/output logic of the level detection circuit and the ternary output circuit shown in FIG. 5.
FIG. 7 shows one example of the construction of a circuit that generates a reference voltage used in FIG. 5.

FIG. 6 shows a list of the logic operations of level detection circuit 22 and ternary output circuit 24 shown in FIG. 5. If the voltage of the signal on internal test data bus line TIO<i> is higher than reference voltage VREFH, the corresponding output circuit (output buffer) of the memory is in a state of outputting H-level data. In this state, both of output signals CH and CL from comparison circuits 41 and 42 are at the H level. Accordingly, output signal TOE of EXNOR circuit 43 turns H level and output signal TDO of AND circuit 44 becomes the H level, as well. In this state, therefore, tri-state buffer circuit 47 is activated and test output data TDQ<i> becomes the H level in accordance with test data TDO transmitted through flip-flop 46 in ternary output state 24.

If the voltage of the signal on internal test data bus line TIO<i> is at a level between the reference voltage VREFH and VREFL levels, internal test data bus line TIO<i> is at a voltage level terminated by terminating resistive element 40 and the corresponding output buffer (output circuit) of the memory is in an output high impedance state. In this state, output signal CH of comparison circuit 41 is at the L level and output signal CL of comparison circuit 42 is at the H level. Accordingly, output signal TOE of EXNOR circuit 43 is at the L level and output signal TDO of AND circuit 44 is at the L level as well. In addition, delayed output enable signal TOED turns L level, so that tri-state buffer circuit 47 enters an output high impedance state and the state of test output data TDQ<i> is set into a high impedance state (Hi-Z).

If the voltage of the signal on internal test data bus line TIO<i> is lower than reference voltage VREFL, the corresponding output circuit of the memory outputs L-level data. In this state, output signals CH and CL of respective comparison circuits 41 and 42 are both at the L level. In addition, output signal TOE of EXNOR circuit 43 is at the H level and output signal TDO of AND circuit 44 is at the L level. Accordingly, if tri-state buffer circuit 47 is activated in accordance with delayed output enable signal TOED, ternary output circuit 24 outputs an L-level signal in accordance with output signal TDO of AND circuit 44 and test output data TDQ<i> is at the L level.

Therefore, with internal test data bus line TIO<i> being precharged (pulled up) to the voltage level of intermediate voltage Vdd/2, when the output buffer of the memory is in an output high impedance state, a state in which bus terminating circuit 10 terminates to the intermediate voltage Vdd/2 level is formed equivalently. As a result, test data TDQ<i> of ternary output circuit 24 can be set in a high impedance state. It is, therefore, possible to make an accurate tri-state determination.

FIG. 7 shows an example of the construction of a reference voltage generation circuit generating reference voltages VREFH and VREFL and intermediate voltage Vdd/2 shown in FIG. 5. In FIG. 7, the reference voltage generation circuit includes resistive elements 50 to 53 connected in series between a power supply node supplying power supply voltage Vdd and a ground node. Resistive elements 50 and 53 have the same resistance value Ra and resistive elements 51 and 52 have the same resistance value Rb. Reference voltage VREFH is outputted from a node 55a, intermediate voltage Vdd/2 is outputted from node 55b and reference voltage VREFL is outputted from a node 55c.

Since the respective resistance values of resistive elements 50 to 53 are set sufficiently high, current consumption in this reference voltage generation circuit is reduced.

Figure 8:
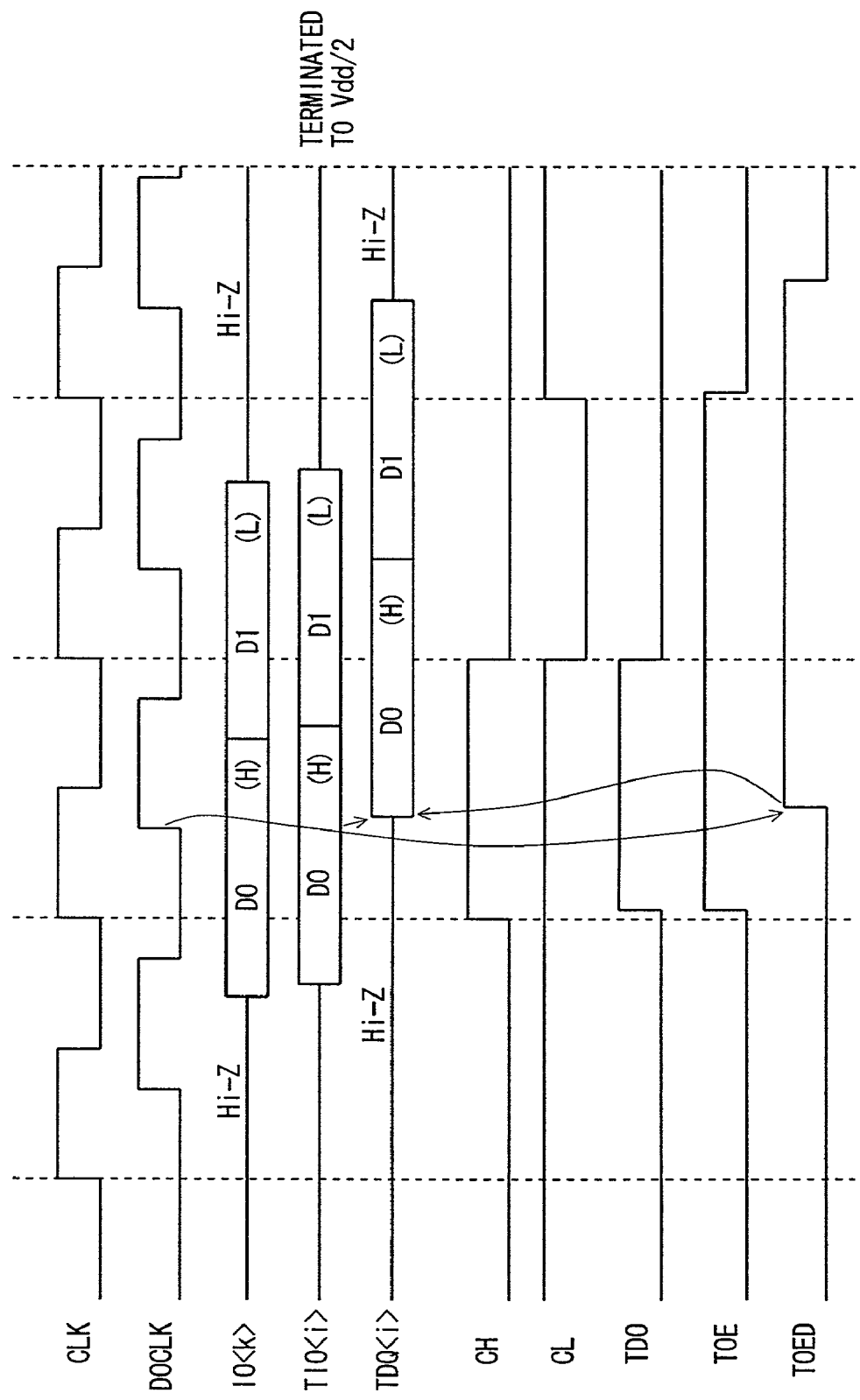
FIG. 8 is a timing diagram representing the operation of the semiconductor integrated circuit device in the first embodiment according to the present invention.

It is noted that the construction of the reference voltage generation circuit shown in FIG. 7 is shown only by way of example, and that a circuit using, for example, an MOS transistor (insulated gate type field effect transistor) may be employed for the reference voltage generation circuit. In addition, reference voltages VREFH and VREFL are set at appropriate voltage levels in accordance with the voltage levels of power supply voltage Vdd and intermediate voltage Vdd/2. Now, the operations of the circuits shown in FIGS. 1 to 7 will be described referring to FIG. 8.

The semiconductor integrated circuit device in this embodiment is operated in accordance with master clock signal CLK as in the case of the conventional semiconductor integrated circuit device. In outputting test data, test data output control clock signal DOCLK is generated in accordance with master clock signal CLK.

As for memory ME (ME0 or ME1), bus terminating circuit 10 is kept inactive and common data bus line IO<k> is kept in a high impedance state until test data is read. Internal test data bus line TIO<i> is pulled up to the intermediate voltage Vdd/2 level. In addition, before outputting test data, ternary output circuit 24 is in an output high impedance state. When test data DO is read from memory ME to common data bus line IO<k> in accordance with mater clock signal CLK, selector 30 shown in FIG. 4 carries out a selection operation, common data bus line IO<k> is coupled to internal test data bus line TIO<i> and the voltage of the signal on internal test data bus line TIO<i> is set to a voltage level corresponding to test data DO. At this moment, ternary output circuit 24 is not activated yet and is in an output high impedance state.

In a default state, internal test data bus line TIO<i> is at the intermediate voltage level. Therefore, comparison circuit 41 outputs the signal CH at L level, and output signal CL of comparison circuit 42 is at the L level.

In accordance with test output data D0, level detection circuit 22 carries out a level detection operation. When the test data is at the H level (power supply voltage level), the output signal of comparison circuit 41 rises from the L level to the H level. On the other hand, output signal CL of comparison circuit 42 is maintained at the H level since the voltage of the signal on internal test data bus line TIO<i> is at a voltage level higher than the reference voltage VREFL level. Test output enable signal TOE from ENOR circuit 43 turns H level and the output signal of AND circuit 44 turns H level as well, in accordance with output signals CH and CL of respective comparison circuits 41 and 42. In accordance with test data output control clock signal DOCLK, delayed output enable signal TOED from flip-flop 45 attains the H level in accordance with test data output enable signal TOE and tri-state buffer circuit 47 of ternary output circuit 24 is activated to output an H-level signal in accordance with test output data TDO transmitted through flip-flop 46.

When an L-level signal is transferred as test data D1, output signal CH of comparison circuit 41 attains the L level and output signal CL of comparison circuit 42 attains the L level as well, in level detection circuit 22. In this state, therefore, test output data TDO from AND circuit 44 attains the L level and output enable signal TOE outputted from EXNOR circuit 43 is maintained at the H level. Flip-flop 45 delays test output enable signal TOE in accordance with test output control clock signal DOCLK and delayed output enable signal TOED is maintained at the H level. In ternary output circuit 24, therefore, tri-state buffer circuit 47 remains active and L-level test data TDQ<i> is generated in accordance with L-level data transferred through flip-flop 46.

When the memory enters an output high impedance state and common data bus line IO<k> turns high impedance state, the common data bus line selected by selector 30 is precharged to the intermediate voltage Vdd/2 level by terminating resistive element 40 of internal test data bus line TIO<i>. In this state, since internal test data bus line TIO<i> is set at the internal voltage Vdd/2 level by terminating resistive element 40, output signal CH of comparison circuit 41 attains the L level and output signal CL of comparison circuit 42 attains the L level. Accordingly, test output data TDO outputted from AND circuit 44 attains the L level and test output enable signal TOE outputted from EXNOR circuit 43 attains the L level. Subsequently, when test data output control clock signal DOCLK rises to the H level, delayed output enable signal TOED from flip-flop 45 attains the L level and tri-state buffer circuit 47 is inactivated to enter an output high impedance state.

Therefore, even if main test instructing signal DMAE is set to be in an active state or at the H level and memory is selectively set in an output high impedance state, these states can be accurately transmitted to and identified by the external tester.

In the normal operation mode, memory test instructing signal DMAE is at the L level, selector 30 is in a nonconductive state, and internal test data bus TIO is disconnected from common data bus 3. Thus, terminating resistive element 40 of level detection circuit 22 exerts no influence on the operation.

In the construction shown in FIG. 5, level detection circuit 22 may be so configured as to be activated when memory test instructing signal DMAE is activated. That is, comparison circuits 41 and 42 may be so configured as to carry out comparison operations when memory test instructing signal DMAE is activated and a current path is formed in these comparison circuits. In addition, terminating resistive element 40 may be so constituted as to terminate internal test data bus line TIO<i> to the intermediate voltage Vdd/2 level when memory test instructing signal DMAE is activated. If an N channel MOS transistor which becomes conductive in response to the activation of memory test instructing signal DMAE is provided between terminating resistive element 40 and internal test data bus line TIO<i>, it is possible to achieve such selective terminating function of the resistive element.

If bus terminating circuit 10 terminates the respective bus lines of the common bus to the intermediate voltage level, there is no need to provide terminating resistive element 40. This is because it is possible to detect in which state of the three states common data bus line IO<i> is, using comparison circuits. In this case, even if the common data bus line is terminated to the intermediate voltage level, no through-current flows in comparison circuits 41 and 42 (because of differential construction) and the memory circuit can be stably operated under actual operation conditions.

As stated so far, according to the first embodiment, by terminating the internal test data bus to the intermediate voltage level, it is possible to realize a state in which the internal common data bus can be equivalently precharged to the intermediate voltage level in the memory test mode. By identifying at which level the output signal of this internal common data bus is, the intermediate voltage level, the H level or the L level, it is possible to easily identify in which of the three states the output buffer of the memory is.

It is noted that the common data bus transfers both write data and read data in the construction described above. However, level detection circuit 22 and selector 30 may be coupled to a read data bus transferring data read from the memory, if the write data bus and the read data bus are separately provided.

Further, even if respective bus lines IO<N−1:0> of common data bus 3 are terminated to the intermediate voltage level, binary signals are generated by comparison circuits 41 and 42 in level detection circuit 22. Thus, it is possible to suppress the occurrence of power supply noise and to carry out an accurate determination operation without causing a through-current.

[Second Embodiment]

Figure 9:
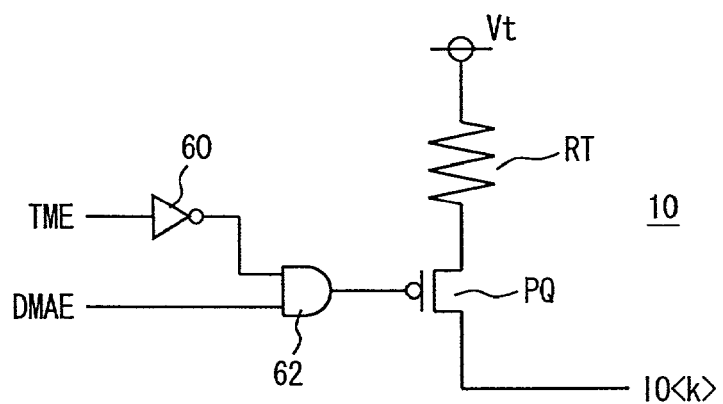
FIG. 9 is a block diagram showing a main portion of a semiconductor integrated circuit device in a second embodiment according to the present invention.

FIG. 9 is a block diagram showing the construction of a bus terminating circuit 10 in the second embodiment according to the present invention. FIG. 9 representatively shows the construction of a bus terminating circuit 10 provided for 1-bit common data bus line IO<k>. In FIG. 9, a bus terminating circuit 10 includes an inverter 60 receiving a special test mode signal TME, an AND circuit 62 receiving the output signal of inverter 60 and a memory test mode instructing signal DMAE, and a P channel MOS transistor PQ rendered conductive when the output signal of AND circuit 62 is at an L level and coupling a resistive element RT to common data bus line IO<k> when conductive.

Special test mode instructing signal TME is set in an active state of an H level in a test mode other than a test mode for performing a test for identifying the ternary state of the output buffer of a memory when the memory is tested using an external tester through DMA circuits 12a and 12b. Therefore, when memory test mode instructing signal DMAE is at the H level and special test mode instructing signal TME is at the L level, the output signal of AND circuit 62 attains the H level, P channel MOS transistor PQ is rendered nonconductive, common data bus 3 (bus line IO<k>) is disconnected from a terminal power supply node and no bus terminating operation is carried out.

On the other hand, when special test mode instructing signal TME is at the H level, the output signal of inverter 60 attains the L level and the output signal of AND circuit 62 attains the L level. In this state, therefore, P channel MOS transistor PQ is maintained conductive, common data bus line IO<k> is coupled to a terminating power supply node Vt and a bus terminating operation is carried out. In this state, it is possible to operate the memory for performing a test with respect to AC (alternating current) characteristics such as an access time and setup/hold times. Special test mode instructing signal TME is applied from the external tester.

Figure 10:
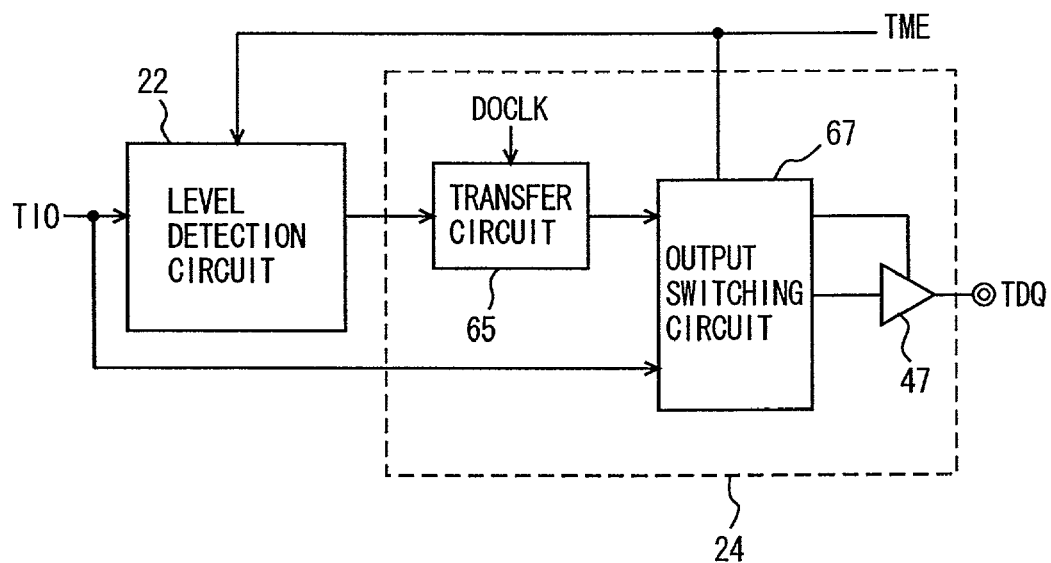
FIG. 10 is a schematic diagram showing the construction of a DMA circuit in the second embodiment according to the present invention.

FIG. 10 is a schematic diagram showing the constructions of a level detection circuit 22 and a ternary output circuit 24 in the second embodiment according to the present invention. When special test mode instructing signal TME is activated, level detection circuit 22 is inactivated and accordingly, is prohibited from carrying out a level detection operation. Ternary output circuit 24 includes a transfer circuit 65 for transferring the output signal of level detection circuit 22 in accordance with test data output control clock signal DOCLK, and an output switching circuit 67 for selecting one of the signal outputted from transfer circuit 65 and a signal on an internal test data bus TI and applying the selected signal to a tri-state buffer circuit 47.

When special test mode instructing signal TME is in an active state of the H level, the detection operation of level detection circuit 22 is prohibited. In this state, an output switching circuit 67 selects the signal on internal test data bus (line) TIO, applies the selected signal to tri-state buffer circuit 47 and sets tri-state buffer circuit 47 normally in an enabled state. On the other hand, when special test mode instructing signal TME is in an inactive state of the L level, level detection circuit 22 carries out a level detection operation, and output switching circuit 67 selects a signal transferred from transfer circuit 65 and applies the selected signal to tri-state buffer circuit 47. In this state, therefore, the same test operation as that described in the first embodiment is carried out.

In FIG. 10, tri-state buffer circuit 47 is shown outputting 8-bit data. If internal test data bus TIO is 1-bit test data bus line TIO<i>, tri-state buffer circuit 57 outputs 1-bit data as in the case of the construction shown in FIG. 5. In this embodiment, general symbols TIO and TDQ are used to represent the operation and construction of the entire of tri-state output circuit 24.

Figure 11:
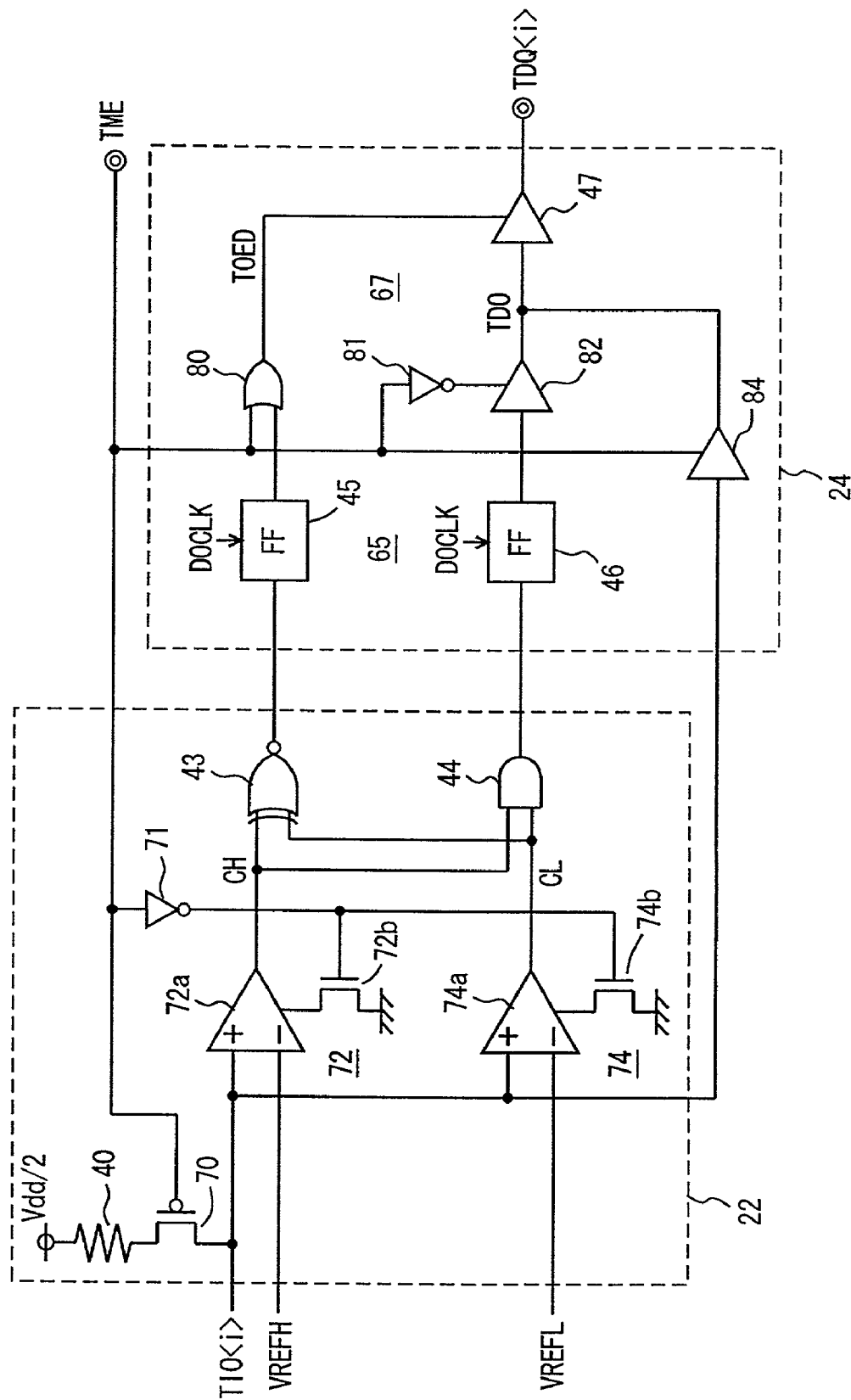
FIG. 11 is a block diagram specifically showing the constructions of a level detection circuit and a ternary output circuit shown in FIG. 10.

FIG. 11 is a block diagram showing the constructions of level detection circuit 22 and ternary output circuit 24 shown in FIG. 10. FIG. 11 representatively shows the constructions of level detection circuit 22 and ternary output circuit 24 related to 1-bit data output. The circuit construction shown in FIG. 11 is provided for each test data bit.

In FIG. 11, level detection circuit 22 includes a P channel MOS transistor 70 rendered nonconductive when special test mode instructing signal TME is activated and disconnecting terminating resistive element 40 from internal test data bus line TIO<i> when nonconductive, an inverter 71 inverting special test mode instructing signal TME, a comparison circuit 72 selectively activated in response to special test mode instructing signal TME and comparing a signal on internal test data bus line TIO<i> with a reference voltage VREFH when activated, a comparison circuit 74 selectively activated in response to special test mode instructing signal TME and comparing the signal on internal test data bus line TIO<i> with reference voltage VREFL when active, an EXNOR circuit 43 receiving the output signal CH of comparison circuit 72 and the output signal CL of comparison circuit 74, and an AND circuit 44 receiving output signal CH of comparison circuit 72 and output signal CL of comparison circuit 74.

Comparison circuit 72 includes a comparator 72a for comparing the signal on internal test data bus line TIO<i> with reference voltage VREFH when active, and an activating transistor 72b rendered conductive when the output signal of inverter 71 is at the H level and forming an operation current flowing path for comparator 72a when made active.

Comparison circuit 74 includes a comparator 74a comparing the signal on internal test data bus line TIO<i> with reference voltage VREFL when being active, and an activating transistor 74b which turns conductive when the output signal of inverter 71 is at the H level and forming an operation current flowing path for comparator 74a when made conductive. Each of activating transistors 72b and 74b is constituted of an N channel MOS transistor.

With the construction of level detection circuit 22 shown in FIG. 11, when special test mode instructing signal TME is at the H level, the output signal of inverter 71 is at the H level. In this state, P channel MOS transistor 70 is in a conductive state, terminating resistive element 40 is coupled to internal test data bus line TIO<i> and comparison circuits 72 and 74 are activated to carry out the comparison operations. Level detection circuit 22, therefore, carries out the same operation as that in the first embodiment.

On the other hand, when special test mode instructing signal TME is at the H level, P channel MOS transistor 70 is nonconductive, and internal test data bus line TIO<i> is disconnected from terminating resistive element 40, and an operation for terminating internal test data bus line TIO<i> to an intermediate voltage Vdd/2 level is prohibited.

Further, when the output signal of inverter 71 attains an L level, activating transistors 72b and 74b are rendered nonconductive, comparison circuits 72 and 74 are inactivated and comparison circuits 72 and 74 do not carry out comparison operations. In a special test operation mode, level detection circuit 22 is inactivated, thereby reducing consumed current and moreover, decreasing the possibility of the occurrence of power supply noise while a memory is being tested. Besides, the current consumption of the memory can be made almost the same as that in an actual operation, to make it possible to accurately test the memory with respect to memory access time or others.

It is noted that level detection circuit 22 may be constituted to be set in an inactive state in a normal access operation mode in which the memory is not tested.

In ternary output circuit 24, transfer circuit 65 includes flip-flops (FF) 45 and 46 transferring the output signals of EXNOR circuit 43 and AND circuit 44 in accordance with test data output control clock signal DOCLK, respectively.

Output switching circuit 67 includes an OR circuit 80 receiving the output signal of flip-flop 45 and special test mode instructing signal TME, an inverter 81 inverting special test mode instructing signal TME, a tri-state buffer circuit 82 activated when the output signal of inverter 81 is at the H level and buffering and transmitting the output signal of flip-flop 46 when active, and a tri-state buffer circuit 84 activated when special test mode instructing signal TME is at the H level, buffering the signal on internal test data bus line TIO<i> for transference to tri-state buffer circuit 47.

With the construction of ternary output circuit 24 shown in FIG. 11, when special test mode instructing signal TME is at the L level, OR circuit 80 is operated as a buffer to transfer the output signal of flip-flop 45, as a delayed output enable signal, to tri-state buffer circuit 47. In addition, the output signal of inverter 81 is at the H level, tri-state buffer circuit 82 is activated to buffer the output signal of flip-flop 46 for transmission to tri-state buffer circuit 47. Here, tri-state buffer circuit 84 is in an inactive state, or in an output high impedance state.

In this state, therefore, ternary output circuit 24 generates a delayed output enable signal TOED and test output data TDO in accordance with the output signal of level detection circuit 22 and controls the output state of tri-state buffer circuit 47 as in the case of the first embodiment.

On the other hand, when special test mode instructing signal TME attains the H level, delayed output enable signal TOED from OR circuit 80 is normally at the H level and tri-state buffer circuit 47 is normally activated. On the other hand, the output signal of inverter 81 attains the L level, tri-state buffer circuit 82 enters an output high impedance state, but tri-state buffer circuit 84 is activated to generate test output data TDO in accordance with the signal on internal test data bus line TIO<i> and to apply generated test output data TDO to tri-state buffer circuit 47.

In this state, therefore, the signal on internal test data bus line TIO<i> is transmitted to the external tester asynchronously with test data output control clock signal DOCLK. Accordingly, in this special test mode, the terminating circuit for internal common data bus 3 can be activated and therefore, a test can be performed to determine whether specification values such as an access time and setup/hold times are satisfied while the common data bus 3 is terminated to a predetermined voltage level.

Therefore, by selectively inactivating level detection circuit 22 and by providing output switching circuit 67 in ternary output circuit 24, it is possible to set the memory bus at a terminated voltage for testing the memory operation under actual operating conditions, besides the test for determining whether the output buffer circuits of the memory are operated correctly in three states.

In other words, when special test mode instructing signal TME is set to the H level of an activated state and memory test instructing signal DMAE is set at the H level, the memory can be tested while terminating voltage Vt of common data bus 3 can be set in a valid state, and the output data of the memory can be monitored externally asynchronously with test data output control clock signal DOCLK.

When special test mode instructing signal TME is at the L level and memory test instructing signal DMAE is at the H level, terminating voltage Vt of common data bus 3 is invalidated, terminating voltage Vdd/2 applied by terminating resistive element 40 is validated and level detection circuit 22 can identify whether output buffer is normally operated in a ternary state.

When memory test instructing signal DMAE is set at the L level, the operation mode is switched to the normal operation mode. In this mode, terminating voltage Vt for common data bus 3 is validated, and selector 20 shown in FIG. 1 becomes a nonconductive or enters a high impedance state. Accordingly, internal test data bus TIO is disconnected from common data bus line IO<i-0>, and the semiconductor integrated circuit device is accurately operated in the normal operation mode without any influence of the test interface circuit.

By inactivating level detection circuit 22 in the normal operation mode, consumed current can be reduced in the normal operation mode. As for the construction for inactivating the level detection circuit in the normal operation mode, any configuration for setting special test mode instructing signal TME at the H level in the normal operation mode can be employed. By providing a pull-up resistive element on an input terminal receiving special test mode instructing signal TME, it is possible to prohibit the operation of level detection circuit 22 in the normal operation mode.

As stated so far, according to the second embodiment of the present invention, the bus terminating circuit is selectively validated/invalidated, the level detection circuit is selectively activated/inactivated and the data output path of the ternary output circuit is switched using special test mode instructing signal. It is, therefore, possible to perform a test for determining the ternary operation of the output buffer circuit of the memory and perform a test while the memory is operated under actual operation conditions.

[Third Embodiment]

FIG. 12 is a block diagram showing the construction of a DMA circuit in the third embodiment according to the present invention. Since DMA circuits 12a and 12b have the same construction, FIG. 12 representatively shows one DMA circuit 12 and specifically the construction of a portion of DMA circuit 12 for outputting 1-bit test data TDQ<i> as in the case of the preceding embodiments.

In FIG. 12, DMA circuit 12 includes a ⅛ selector 90 provided for 8-bit common data bus lines IO<X> to IO<X+7>, for carrying out a ⅛ selection operation in accordance with test data select signals TDS<2:0>, not shown, a resistive element 91 having an end coupled to a power supply node supplying power supply voltage Vdd, a P channel MOS transistor 92 for selectively coupling resistive element 91 with internal test data bus line TIO<i> in accordance with a terminating potential polarity control signal TML applied from an external tester, a resistive element 93 having an end coupled to a ground node, an N channel MOS transistor 94 for coupling resistive element 93 with internal test data bus line TIO<i> in accordance with a terminating potential polarity control signal TMH, a flip-flop (FF) 95 for transferring a signal on internal test data bus line TIO<i> in accordance with test data output control clock signal DOCLK, and a buffer circuit 96 for buffering and externally outputting the signal transferred from flip-flop 95. Buffer circuit 96 is an ordinary buffer circuit driven in binary states.

In the third embodiment, bus terminating circuit 10 continuously carries out a bus terminating operation. Resistive elements 92 and 93 have resistance values sufficiently lower than that of the terminating resistive element of bus terminating circuit 10. The potential of internal data bus TIO<i> is, therefore, set according to the states of resistive elements 91 and 92.

Now, the operation of DMA circuit 12 shown in FIG. 12 will be described with reference to a timing diagram shown in FIG. 13.

Before time t0, bus terminating circuit 10 carries out a terminating operation on the internal common data bus unlike the construction described in the first embodiment, and internal common data bus 3 is terminated to the H level. In a default state, terminating potential polarity control signal TML is at the H level and terminating potential polarity control signal TMH is at the L level. In this state, therefore, both of MOS transistors 92 and 94 are in a nonconductive state, and internal test data bus line TIO<i> is in a high impedance state. When ⅛ selector 90 carries out a selection operation, internal test data bus line TIO<i> is pulled up to the H level by the bus terminating circuit provided for the selected common data bus line.

At a time t0, when both of terminating potential polarity control signals TML and TMH are set at the H level, MOS transistor 94 enters a conductive state and internal test data bus line TIO<i> is pulled down to the ground potential level. Accordingly, in response to the rise of test data output control clock signal DOCLK, test output data TDQ<i> outputted from buffer circuit 96 attains the L level.

On the other hand, when both of terminating potential polarity control signals TML and TMH are set at the L level at time t1, MOS transistor 92 turns conductive, MOS transistor 94 turns nonconductive and internal test data bus line TIO<i> is pulled up to the power supply voltage Vdd level. Accordingly, in response to the next rise of test data output control clock signal DOCLK, test output data TDQ<i> from buffer circuit 96 attains the H level.

When the output buffer of the memory is not in a high impedance state and outputs valid data (a state is indicated in which 8-bit data of "1s" are outputted in parallel in FIG. 13) in a cycle after time t1, resistive elements 91 and 93 function as a pull-up resistive element and a pull-down resistive element, respectively and internal test data bus line TIO<i> is set at a voltage level corresponding to the test data read from the memory.

At time t2, when terminating potential polarity control signals TML and TMH are set at the H level and the L level, respectively, MOS transistors 92 and 94 are both turned off and internal test data bus line TIO<i> attains a potential level corresponding to the data transferred from the memory. Accordingly, if the external tester samples the test data outputted in response to the rise of test data output control clock signal DOCLK, the external tester can determine the logical level of the test data read from the memory.

Therefore, even if the bus terminating operation for the common data bus is not prohibited, it is possible to identify whether or not the output buffer of the memory is in an output high impedance state by changing the polarity of the terminating potentials of internal test data bus line(s) TIO (TIO<7:0>) in accordance with terminating potential polarity control signals TML and TMH in DMA circuit 12.

Specifically, if the logical level of test output data TDQ<i> is changed in accordance with terminating potential polarity control signals TML and TMH, the memory is in an output high impedance state. If valid data is outputted from the memory, by stopping the terminating of the internal test data bus lines, irrespectively of the terminating potential level of common data bus 3, the internal test data bus lines can be set at a potential level according to the data read from the memory. Thus, it is possible to accurately identify whether or not the memory is in an output high impedance state. It is also possible to accurately determine whether the memory cell data is data corresponding to test write data. It is, therefore, possible to determine the ternary operation of the memory.

It is noted that terminating potential polarity control signals TML and TMH are set at the H level and the L level, respectively, in modes other than the mode for testing the high impedance state of the memory, so that internal test data bus line TIO<i> is set in a high impedance state to reduce current consumption.

In this case, in the normal test mode or when a test is performed to determine the logical level of memory cell data, internal test data bus TIO is terminated to the same voltage level as that of internal common data bus 10. It is, therefore, possible to accurately read data corresponding to the output data read from a memory cell externally and to accurately test the memory.

It is noted that DMA circuit 12 shown in FIG. 12 may be constituted such that buffer circuit 96 is activated in this test mode.

Further, in the above description, a terminating operation is carried out for common data bus 3 and the polarity of the terminating voltage of common data bus 3 is changed by resistive elements 91 and 92. However, even if bus terminating circuit 10 is so configured as to be inactivated in this test mode, the polarity of the terminating voltage of internal test data bus line TIO<i> can be changed with the resistive elements 91 and 92 used as the terminating resistive elements, and it is therefore possible to accurately identify whether or not the memory is in an output high impedance state.

In an operation in the case of stopping the operation of bus terminating circuit 10 in the test mode, the potential of internal test data bus TIO can be changed using terminating potential polarity control signals TML and TMH to identify whether the memory is in the output high impedance state. In addition, even if either resistive element 91 or 92 is set conductive to the internal test data bus, internal test data bus TIO can be set at a potential level corresponding to the data from memory and data corresponding in logical level to the data read from the memory can be outputted externally.

Further, in this case, the terminating voltage level of bus terminating circuit 10 may be either the power supply voltage level or the intermediate voltage level.

As stated so far, according to the third embodiment of the present invention, the polarity of the terminating voltage of the internal test data bus is configured to be changeable and it is, therefore, possible to accurately identify whether or not a memory is in an output high impedance state.

[Fourth Embodiment]

Figure 14:
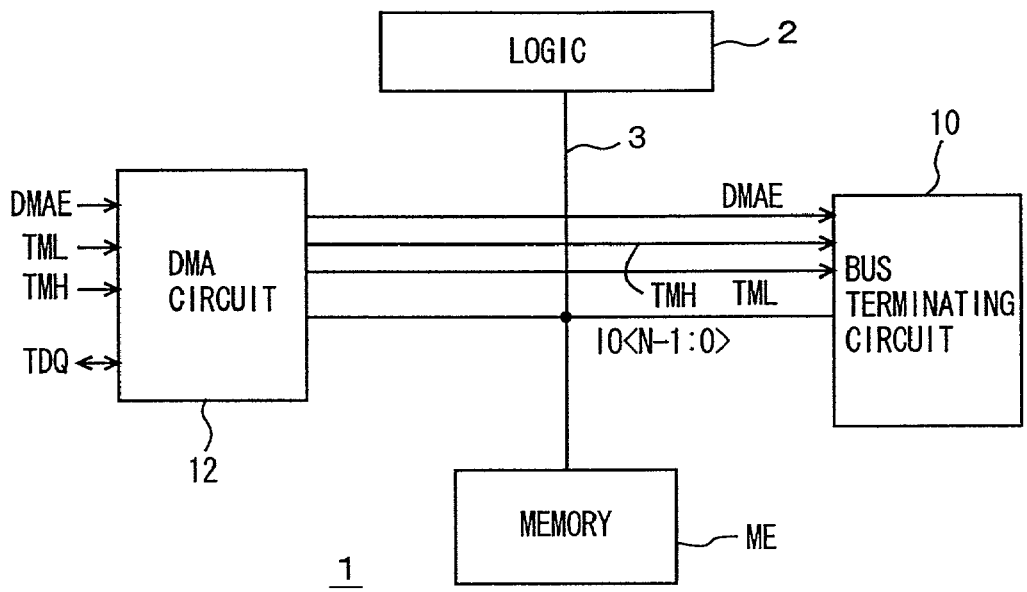
FIG. 14 is a schematic diagram showing the overall construction of a semiconductor integrated circuit device in a fourth embodiment according to the present invention.

FIG. 14 is a schematic diagram showing the overall construction of a semiconductor integrated circuit device in the fourth embodiment according to the present invention. In the construction of the semiconductor integrated circuit device shown in FIG. 14, a memory test instructing signal DMAE and terminating voltage polarity control signals TMH and TML are applied to bus terminating circuit 10 provided for a common data bus 3 through a DMA circuit 12. Common data bus 3 interconnects a logic 2 and a memory ME (ME0 or ME1), and includes data bus lines IO<N-1:0>.

In a DMA circuit 12, differently from the preceding third embodiment, resistive elements 91 and 92 are not provided. ⅛ selector 90 shown in FIG. 12 selects one of common data bus lines IO<N-1:0> and data on the selected common data bus line (internal test data bus line) is outputted externally as test data TDQ in accordance with an output control clock signal DOCLK.

The polarity of the terminating voltage is changed in bus terminating circuit 10, and it is determined externally whether or not the data output buffer of memory ME is in an output high impedance state in accordance with the voltage levels of terminating voltage polarity control signals TMH and TML and the logical level of read out test data. The control of terminating voltage polarity control signals ML and TMH in this case is the same as that described in the third embodiment.

Figure 15:
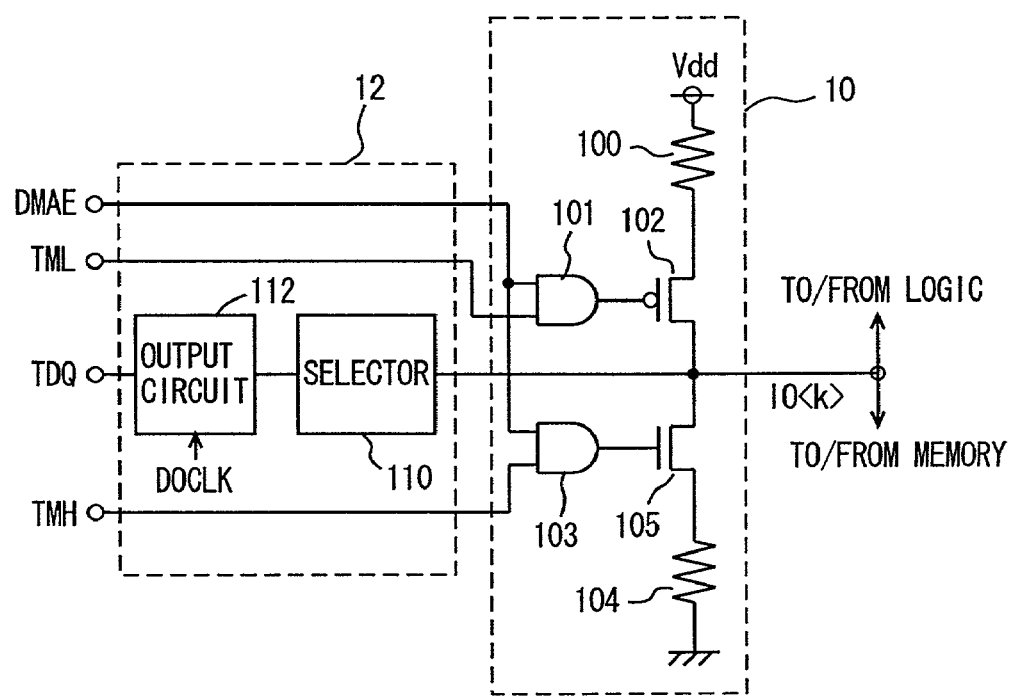
FIG. 15 is a block diagram showing the constructions of a bus terminating circuit and a DMA circuit shown in FIG. 14.

FIG. 15 is a schematic diagram showing the constructions of bus terminating circuit 10 and DMA circuit 12. FIG. 15 shows the constructions of bus terminating circuit 10 and DMA circuit 12 arranged for 1-bit common data bus line IO<k>. The construction of the bus terminating circuit shown in FIG. 15 is provided for each of data bus lines IO<N-1:0> of common data bus 3.

In FIG. 15, bus terminating circuit 10 includes an AND circuit 101 receiving memory test instructing signal DMAE and terminating voltage polarity control signal TML applied through DMA circuit 12, an AND circuit 103 receiving memory test mode instructing signal DMAE and terminating voltage polarity control signal TMH, a resistive element 100 having one end coupled to a power supply node supplying a power supply voltage Vdd, a P channel MOS transistor 102, rendered conductive when the output signal of AND circuit 101 is at an L level, for coupling resistive element 100 to common data bus line IO<k>, a resistive element 104 having one end connected to a ground node, and an N channel MOS transistor 105 rendered conductive when the output signal of AND circuit 103 is at an H level, for coupling the other end of resistive element 104 to common data bus line IO<k>.

The construction of a terminating voltage control section included in bus terminating circuit 10 is the same as that of a terminating voltage control section constituted by components 91 to 94 included in DMA circuit 12 shown in FIG. 12. It is noted, however, that resistive elements 100 and 104 are terminating resistances.

DMA circuit 12 includes a selector 110 for selecting common data bus line IO<k> and an output circuit 112 for sequentially transferring a signal on the common data bus line selected by selector 110 in accordance with a test data output control clock DOCLK and generating test output data TDQ. Selector 110 includes ⅛ selector shown in FIG. 12. Output circuit 112 includes flip-flop 95 and buffer circuit 96 shown in FIG. 12.

In the construction shown in FIG. 15, the polarity of the terminating voltage is controlled not in DMA circuit 12, but in bus terminating circuit 10. Accordingly, an operation for reading test data and an operation for determining the output high impedance state of the output buffer of the memory while controlling memory test instructing signal DMAE and terminating voltage polarity control signals TML and TMH are the same as those shown in the operation sequence of FIG. 13.

Selector 110 is an analog switch and the terminating voltage of common data bus line IO<k> is transmitted to test data bus line TIO<i>. It is, therefore, possible to carry out the same operations as those in the preceding third embodiment and to easily identify whether or not the output buffer of the memory is in a high impedance state.

In a normal operation mode, when the output signal of AND circuit 101 is at the L level, memory test instructing signal DMAE attains the L level, the output signal of AND circuit 101 attains the L level, and responsively, P channel MOS transistor 102 turns conductive. On the other hand, the output signal of AND circuit 103 is at the L level, N channel MOS transistor 105 turns off state, and common data bus line IO<k> is terminated to a power supply voltage Vdd level. In the normal operation, therefore, while the bus is terminated to the power supply voltage Vdd level, a memory access operation can be carried out. Further, each of common data bus lines IO<N-1:0> is terminated to the power supply voltage Vdd level or the ground voltage level. Thus, the voltage levels of common data bus lines IO<N-1:0> are changed between two states. It is, therefore, possible to prevent a through-current from flowing in the DMA circuit by an intermediate voltage level signal.

With the construction shown in FIG. 15, there is no need to provide a circuit for changing the polarity of the terminating voltage in the DMA circuit, thereby making it possible to reduce the occupied area of the DMA circuit.

If common data bus 3 is terminated to an intermediate voltage Vdd/2 level, the terminating circuit for terminating to this intermediate voltage level is inactivated in the memory test mode and the terminating voltage control section shown in FIG. 15 is operated, thereby making it possible to accurately determine whether the output of the memory is in a ternary state.

As stated so far, according to the fourth embodiment of the present invention, the circuit for changing the polarity of the terminating voltage of is arranged in the bus terminating circuit for terminating the data bus between the memory and the logic. It is, therefore, possible to prevent the common data bus from being fixed to the intermediate voltage level, to prevent a through-current from flowing in the DMA circuit accordingly, and to reduce consumed current.

Moreover, the circuit construction for changing the polarity of the terminating voltage is provided in the bus terminating circuit. Thus, there is no need to provide a bus terminating voltage polarity change circuit for each data line in the DMA circuit, making it possible to reduce the occupying area of the DMA circuit.

With the construction shown in FIG. 15, AND circuits 101 and 103 are provided for common data bus lines IO<N-1:0> in common, whereby the operations of the respective bus terminating circuits included in bus terminating circuit 10 are controlled collectively in accordance with the output signals of AND circuits 101 and 103.

It, therefore, suffices that AND circuits 101 and 103 are provided for bus terminating circuit 10 in common to internal common data bus lines IO<N-1:0>, making it possible to sufficiently suppress the increase of the layout area of the circuit.

[Other Examples of Application of the Invention]

The memory assembled together with the logic on the semiconductor chip of the semiconductor integrated circuit device should not be limited to DRAM. They may be an SRAM (static random-access memory) or a flash type EEPROM (electrically erasable, programmable read-only memory). The present invention can be applied to any integrated circuit device as far as the semiconductor integrated circuit device includes a logic and a memory integrated on the same semiconductor chip and the memory can be directly accessed and tested by an external tester through a test interface circuit (DMA circuit) and the memory data bus is terminated.

Moreover, the data bus interconnecting a memory and the logic may be separated into a read data bus and a write data bus. The bus terminating circuit according to the present invention may be provided for this read data bus in this separated read and write data bus arrangement.

As stated so far, according to the present invention, it is possible to control the terminating voltage of the bus terminating circuit terminating the internal data bus, for accurately determining whether or not the output circuit of the memory is in an output high impedance state. In addition, it is possible to prevent a through-current from flowing in the test circuit irrespectively of the terminating voltage level of the bus, and to accurately test the memory while operating the memory under actual operation conditions.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
a memory integrated together with a logic on a same semiconductor substrate; and
test interface circuitry for externally accessing and testing said memory, said test interface circuitry including a potential detection circuit for at least detecting whether a potential of a data output bus of said memory is at an intermediate level between a power supply voltage and a ground voltage.

2. The semiconductor integrated circuit device according to claim 1, wherein
said memory comprises an output buffer for driving said data output bus;
said output buffer is set in an output high impedance state when rendered inactivated; and
said semiconductor integrated circuit device further comprises a bus terminating circuit, coupled to said data output bus, for setting said data output bus at a predetermined potential level.

3. The semiconductor integrated circuit device according to claim 2, further comprising:
a terminal control circuit for selectively activating said bus terminating circuit in response to a test mode control signal for designating a test mode for testing said memory through said test interface circuitry and a potential detection mode for testing said memory using said potential detection circuit.

4. The semiconductor integrated circuit device according to claim 3, further comprising:
a potential detection control circuit for selectively inactivating a potential detecting operation of said potential detection circuit in accordance with said test mode control signal.

5. The semiconductor integrated circuit device according to claim 1, wherein
said test interface circuitry further comprises a test output circuit for outputting an applied signal externally; and
said potential detection circuit comprises:
a first level detection circuit receiving a first reference potential and detecting the potential of said data output bus on the basis of said first reference potential;
a second level detection circuit receiving a second reference potential different in potential level from said first reference potential and detecting the potential of said data output bus on the basis of the second reference potential; and
an output control circuit for controlling a signal output operation of said test output circuit in accordance with output signals of the first and second level detection circuits.

6. The semiconductor integrated circuit device according to claim 1, wherein
said potential detection circuit outputs a detection result through a signal output circuit constituted of a tri-state buffer.

7. A semiconductor integrated circuit device comprising:
a memory integrated together with a logic on a same semiconductor substrate;
test interface circuitry for allowing external access to said memory for testing said memory; and
a switching circuit for changing a terminating voltage level of an output data bus of said memory.

8. The semiconductor integrated circuit device according to claim 7, wherein
said memory comprises an output buffer circuit coupled to said data output bus, said output buffer circuit being set in an output high impedance state when inactivated; and
said semiconductor integrated circuit device further comprises a bus terminating circuit, coupled to said data output bus, for terminating said data output bus; and
said switching circuit is arranged in said test interface circuitry.

9. The semiconductor integrated circuit device according to claim 8, wherein
said bus terminating circuit is selectively inactivated in accordance with a test mode instructing signal.

10. The semiconductor integrated circuit device according to claim 7, wherein
said data output bus is further coupled to said logic; and
said semiconductor integrated circuit device further comprises a bus terminating circuit for terminating said data output bus; and
said switching circuit is arranged in said bus terminating circuit.

11. A semiconductor integrated circuit device comprising:
a logic for performing a predetermined logic processing;
a memory for storing at least data required by said logic;
data bus for interconnecting said memory and said logic to transmit data between said memory and said logic; and
test interface circuitry for allowing external access to said memory directly, said test interface circuitry including (1) a bus selector for selecting a data bus line of said data bus and coupling a selected data bus line to an internal test data line, (2) level detector for at least detecting whether a potential of said internal test data line is at an intermediate level between a power supply voltage and a ground voltage, and (3) a ternary output circuit for outputting ternary data of three states and having an data output state determined in accordance with a result of detection by said level detector.

12. The semiconductor integrated circuit device according to claim 11, wherein said level detector comprises;
terminating circuit, activated in response to a test mode instructing signal, for terminating said internal test data line;
a first comparator for comparing a potential of said internal test data line with a first reference potential;
a second comparator for comparing the potential of said internal test data line with a second reference potential different in potential;
a first gate for detecting coincidence in logic level of output signals of the first and second comparators; and
a second gate for performing a predetermined logical process on the output signals of the first and second comparators and producing test output data; and
said ternary output circuit comprises a three state buffer, activated in response to an output signal of said first gate, for generating external test data corresponding to the test output data received from said second gate.

13. The semiconductor integrated circuit device according to claim 12, further comprising:
enabling circuit for inactivating the first and second comparators in response to said test mode instructing signal;
control gate for setting the output signal of said first gate in a enabled state for operating said test output circuit in bi-states and for prohibiting transference of the output signal of said second gate in response to the test mode instructing signal; and buffer circuit for transferring data on said internal test data line to said test output circuit in response to said test mode instructing signal.

14. The semiconductor integrated circuit device according to claim 11, further comprising bus terminating circuit, activated in response to inactivation of a test mode instructing signal, for terminating said data bus, said test mode instructing signal enabling said level detector when activated.

* * * * *